(12) United States Patent
Guo et al.

(10) Patent No.: US 12,211,791 B2
(45) Date of Patent: *Jan. 28, 2025

(54) SEMICONDUCTOR DEVICE INCLUDING DEEP VIAS

(71) Applicant: TAIWAN SEMICONDUCTOR MANUFACTURING COMPANY, LTD., Hsinchu (TW)

(72) Inventors: Ta-Pen Guo, Hsinchu (TW); Chien-Ying Chen, Hsinchu (TW); Li-Chun Tien, Hsinchu (TW); Lee-Chung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/517,354

(22) Filed: Nov. 22, 2023

(65) Prior Publication Data

US 2024/0088024 A1   Mar. 14, 2024

Related U.S. Application Data

(63) Continuation of application No. 18/156,711, filed on Jan. 19, 2023, now Pat. No. 11,854,966, which is a continuation of application No. 17/410,782, filed on Aug. 24, 2021, now Pat. No. 11,574,865, which is a continuation of application No. 16/530,808, filed on Aug. 2, 2019, now Pat. No. 11,127,673.

(60) Provisional application No. 62/720,051, filed on Aug. 20, 2018.

(51) Int. Cl.
*H01L 23/522* (2006.01)
*G06F 30/394* (2020.01)

(52) U.S. Cl.
CPC ........ *H01L 23/5226* (2013.01); *G06F 30/394* (2020.01)

(58) Field of Classification Search
CPC .................................................. H01L 23/5226
See application file for complete search history.

(56) References Cited

U.S. PATENT DOCUMENTS

| | | | |
|---|---|---|---|
| 7,260,442 | B2 | 8/2007 | Hwang et al. |
| 7,698,676 | B1 | 4/2010 | Qian |
| 9,256,709 | B2 | 2/2016 | Yu et al. |
| 9,911,651 | B1 | 3/2018 | Briggs et al. |
| 11,127,673 | B2 * | 9/2021 | Guo ................. H01L 23/5226 |
| 11,574,865 | B2 | 2/2023 | Guo et al. |
| 2010/0200992 | A1 | 8/2010 | Purushothaman et al. |
| 2014/0040838 | A1 | 2/2014 | Liu et al. |

(Continued)

*Primary Examiner* — Douglas M Menz
(74) *Attorney, Agent, or Firm* — Hauptman Ham, LLP

(57) ABSTRACT

A semiconductor device includes a transistor layer, a first via layer over the transistor layer, a first metallization layer over the first via layer, the first metallization layer including first conductors having long axes extending substantially in a first direction, a second via layer over the first metallization layer, and a conductive deep via extending in the second via layer, the first metallization layer, and the first via layer. The first conductors represent a majority of conductive material in the first metallization layer, and a size of the deep via in the first direction in the first metallization layer is substantially less than a minimum length of the first conductors in the first metallization layer.

20 Claims, 13 Drawing Sheets

(56) References Cited

U.S. PATENT DOCUMENTS

| | | |
|---|---|---|
| 2015/0278429 A1 | 10/2015 | Chang |
| 2015/0357282 A1 | 12/2015 | Lau et al. |
| 2017/0199955 A1 | 7/2017 | Won et al. |
| 2018/0060475 A1 | 3/2018 | Sinha et al. |
| 2018/0114752 A1* | 4/2018 | Briggs ................. H01L 23/528 |
| 2018/0150586 A1 | 5/2018 | Tien et al. |
| 2018/0294256 A1 | 10/2018 | Lee et al. |
| 2020/0058548 A1 | 2/2020 | Han et al. |

\* cited by examiner

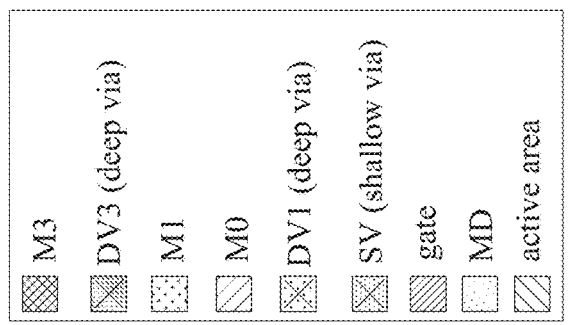
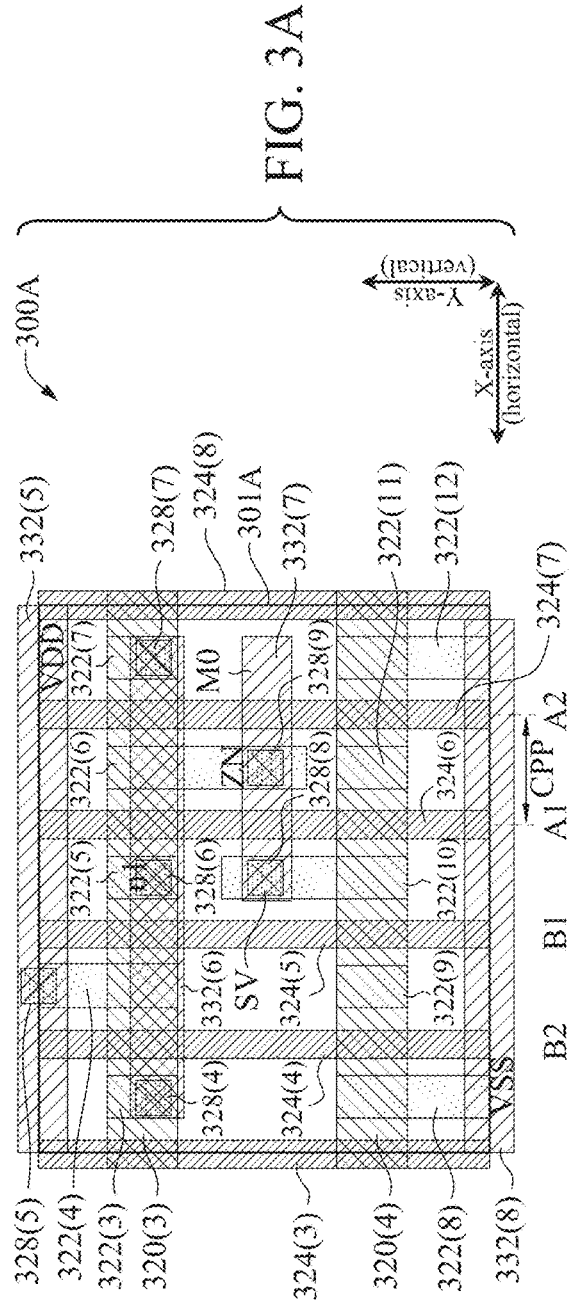
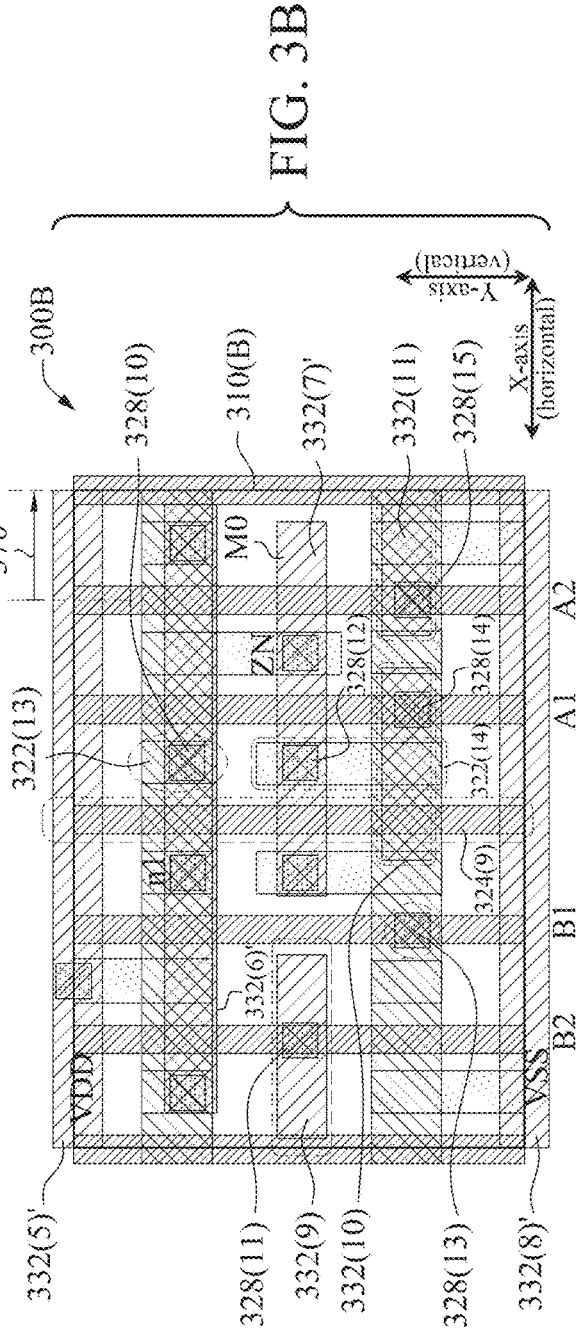
FIG. 3A
FIG. 3B

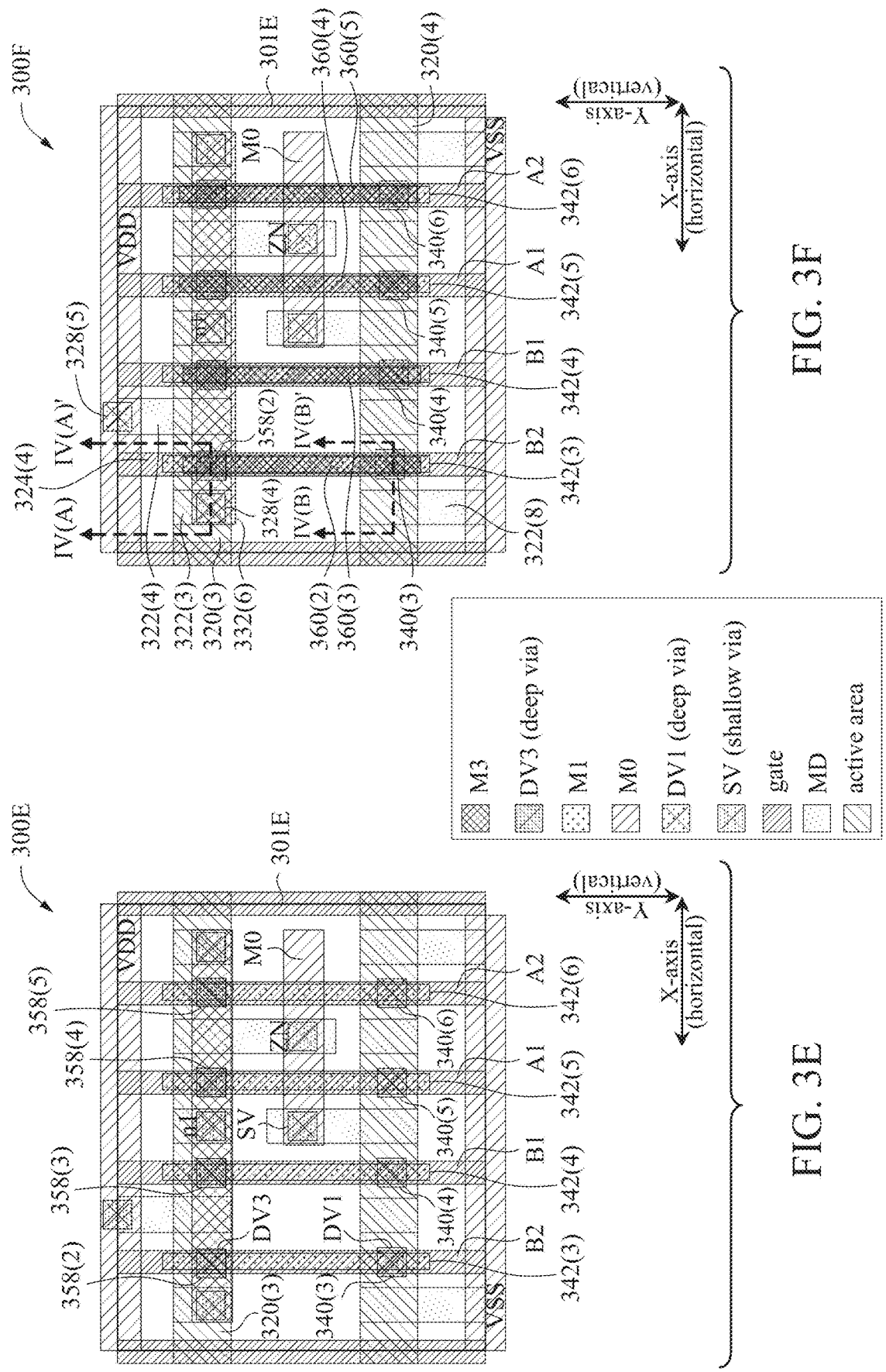

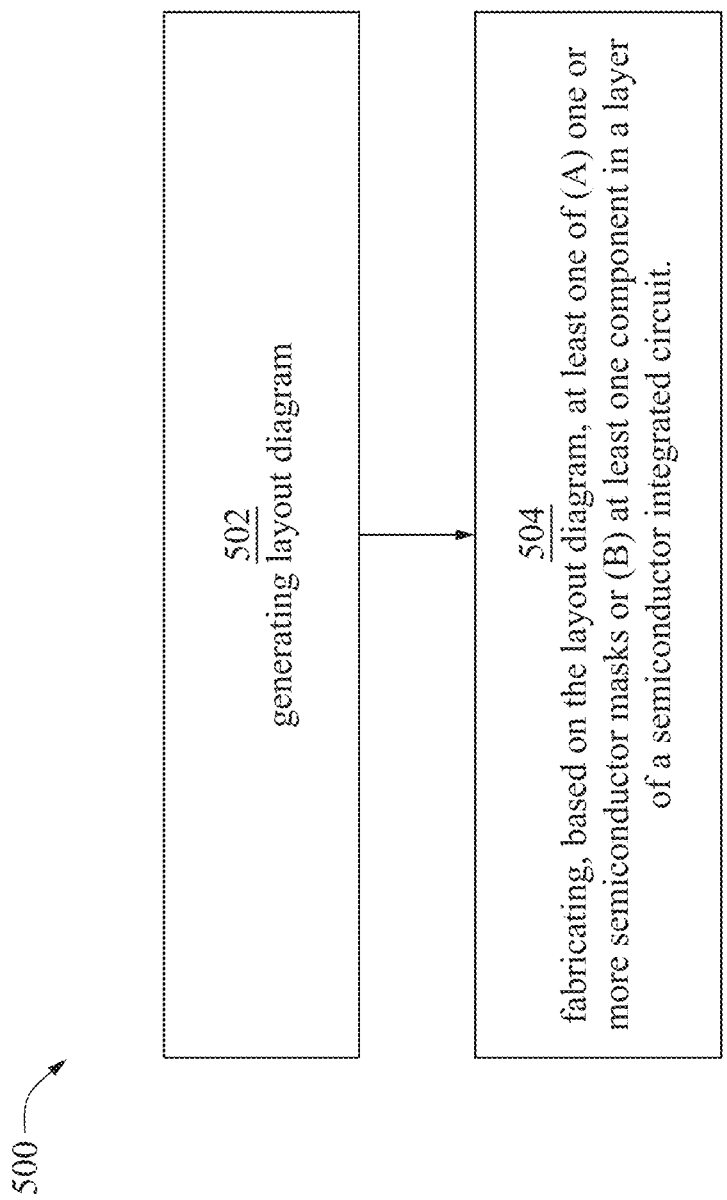

SEMICONDUCTOR DEVICE INCLUDING DEEP VIAS

PRIORITY CLAIM AND CROSS-REFERENCE

This application is a continuation of U.S. patent application Ser. No. 18/156,711, filed Jan. 19, 2023, now U.S. Pat. No. 11,854,966, issued Dec. 26, 2023, which is a continuation of U.S. patent application Ser. No. 17/410,782, filed Aug. 24, 2021, now U.S. Pat. No. 11,574,865, issued Feb. 7, 2023, which is a continuation of U.S. patent application Ser. No. 16/530,808, filed Aug. 2, 2019, now U.S. Pat. No. 11,127,673, issued Sep. 21, 2021, which claims the priority of U.S. Provisional Patent Application Ser. No. 62/720,051, filed Aug. 20, 2018, which are incorporated herein by reference in their entireties.

BACKGROUND

An integrated circuit ("IC") includes one or more semiconductor devices. One way in which to represent a semiconductor device is with a plan view diagram referred to as a layout diagram. Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization.

Typically, a set of design rules is specific to a process technology node by which will be fabricated a semiconductor device based on a layout diagram. The design rule set compensates for variability of the corresponding process technology node. Such compensation increases the likelihood that an actual semiconductor device resulting from a layout diagram will be an acceptable counterpart to the virtual device on which the layout diagram is based.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are corresponding layout diagrams, in accordance with some embodiments.

FIG. 5 is a flowchart, in accordance with some embodiments.

DETAILED DESCRIPTION

Figure 1:
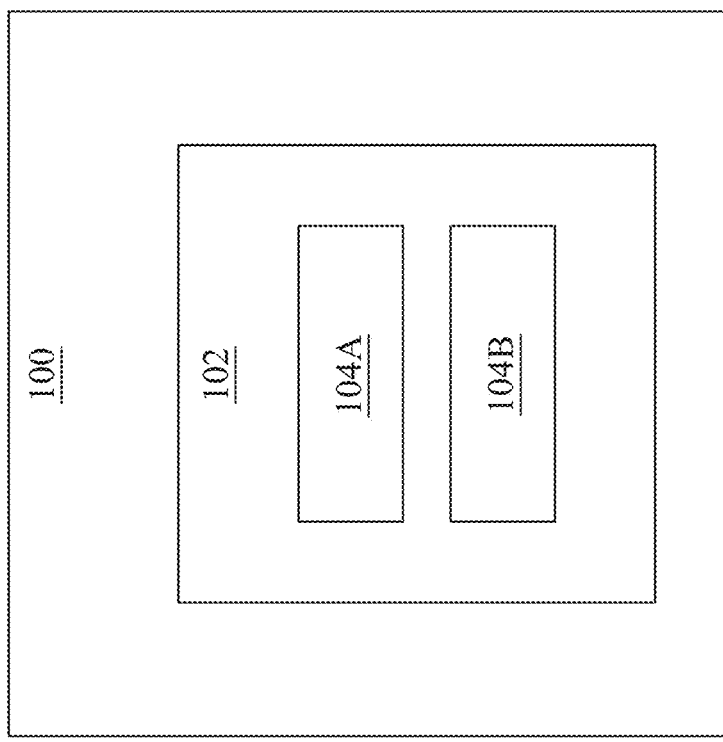
FIG. 1 is a block diagram, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate relationships between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure describes at least one technique for addressing the wiring/metallization congestion associated with an increased number of pins for routing an input signal. The present disclosure describes one or more embodiments using metallization connections to alleviate congestion produced by input pins and local routing used to implement the input pins. Moreover, at least one technique described herein alleviates violation of metallization minimum area rules by using deep via structures to connect metallization layers.

FIG. 1 is a block diagram of a semiconductor device 100 in accordance with some embodiments. In FIG. 1, semiconductor device 100 includes, among other things, a circuit macro (hereinafter, macro) 102. In some embodiments, macro 102 is an SRAM macro. In some embodiments, macro 102 is a macro other than an SRAM macro. Macro 102 includes, among other things, one or more cell regions 104A having a deep via structure in a single-stack arrangement (see cross-section of FIG. 2A), and one or more cell regions 104B having two deep via structure in a double-stack arrangement (see cross-section of FIG. 2B). Examples of layout diagrams which are used to fabricate cell regions 104A and/or 104B include the layout diagrams disclosed herein.

Figure 2A:
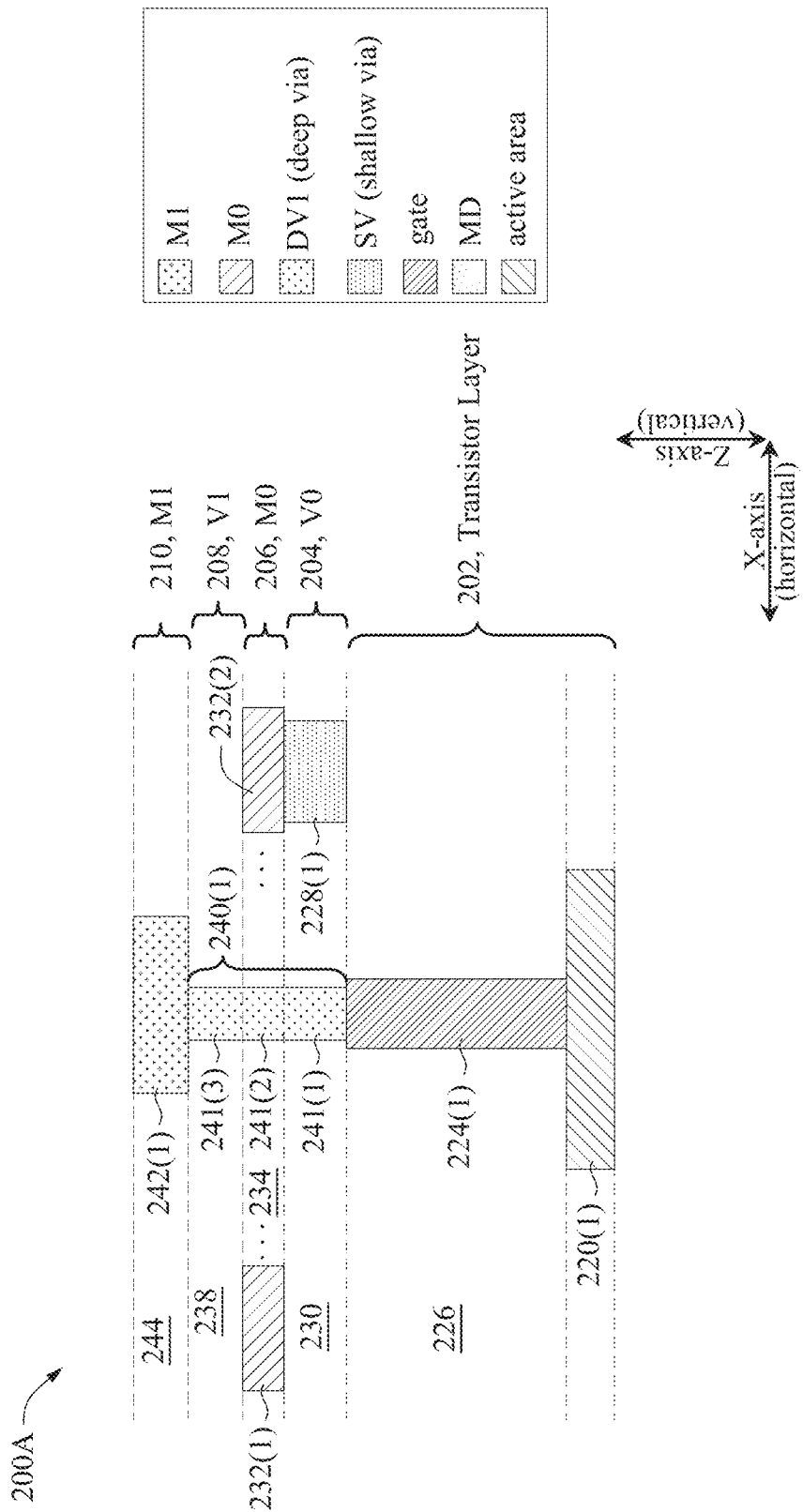
FIGS. 2A-2B are corresponding cross-sectional views, in accordance with some embodiments.

FIG. 2A is a cross-sectional view of a part 200A of a semiconductor device, in accordance with some embodiments.

More particularly, in FIG. 2A, the cross-section of part 200A represents an interconnection architecture that includes a deep via structure 240(1). Part 200A and the semiconductor device including the same are corresponding examples of semiconductor device 100 and cell region 104A of FIG. 1.

Part 200A includes a transistor layer 202, a first (V_1st) layer 204 of via structures on transistor layer 202, and a first (M_1st) layer of metallization over the first (V_1$^{st}$) layer 204. Here, it will be assumed that the numbering convention of the corresponding design rules of the corresponding semiconductor process technology node begins with the V_1st layer and the M_1st layer being referred to correspondingly as V0 and M0. In some embodiments, the numbering convention begins with the V_1st layer and the M_1st layer being referred to correspondingly as V1 and M1. Part 200A further includes: a V1 layer 208 over M0 layer 206; and a M1 layer 210 over V1 layer 208.

Transistor layer 202 includes: an active region 220(1); a gate structure 224(1) and an interlayer dielectric (ILD) 226. Relative to a first direction, which is the Z-axis in FIG. 2A, gate structure 224(1) and some portions of ILD 226 are located over active region 220(1). In some embodiments, the first direction is a direction of than the Z-axis. In some embodiments, active region 220(1) is configured as one or more fins according to finFET technology. In some embodiments, active region 220(1) is configured for planar transistor technology. In some embodiments, active region 220(1) is configured for a technology other than finFET or planar transistor technologies. In some embodiments, portions of active region 220(2), gate structure 224(2) and (again) active region 220(2) correspond to drain/source, gate and source/drain structures of corresponding NMOS/PMOS transistors. A long axis of active region 220(1) extends along a first direction substantially perpendicular to the first direction. In FIG. 2A, the second direction is the X-axis. In some embodiments where the first direction is a direction other than the Z-axis, the second direction is a direction other than the X-axis. In FIG. 2A, a long axis of gate structure 224(1) extends along a third direction not shown that is substantially perpendicular to the first and second directions. In some embodiments, where the first direction and second directions are corresponding directions other than correspondingly the Z-axis and the X-axis, the third direction is a direction other than the Y-axis. In some embodiments, the gate structure 224 is polysilicon. In some embodiments, gate structure 224(1) is a material other than polysilicon.

For purposes of discussion including establishing a context for discussing the interconnection architecture which includes deep via structure 240(1), V0 layer 204 includes a via structure 228(1), and M0 layer 206 includes conductors 232(1) and 232(2). Relative to the X-axis, conductor 232(2) substantially overlaps via structure 228(1). Relative to the X-axis, none of via structure 228(1), conductor 232(2) nor conductor 232(1) overlaps gate structure 224(1). Though included in part 200A, nevertheless none of via structure 228(1), conductor 232(2) nor conductor 232(1) represents a part of the interconnection architecture which includes deep via structure 240(1).

Deep via structure 240(1) is located over gate structure 224(1). Relative to the Z-axis, deep via structure 240(1) spans V0 layer 204, M0 layer 206 and V1 layer 208. In some embodiments, deep via structure 240(1) is an example of a deep via structure referred to as a DV1 structure. Deep via structure 240(1) includes portions 241(1), 241(2) and 241(3) located correspondingly in V0 layer 204, M0 layer 206 and V1 layer 208. In some embodiments, deep via structure 240(1) is an integral structure. In some embodiments, portions 241(1), 241(2) and 241(3) represent corresponding discrete structures such that deep via structure 240(1) is a composite structure. Portions 241(1), 241(2) and 241(3) represent conductive material in corresponding layers V0 layer 204, M0 layer 206 and V1 layer 208.

Relative to a plane corresponding to the X-axis and the Y-axis (the latter not shown in FIG. 2A), each of deep via structure 240(1) and via structure 228(1) has a substantially square shape. A width W0 (along the X-axis) of the deep via structure 240(1) along the X-axis is substantially less than a minimum length Lmin0 of a majority of the conductors in layer M0 206. In some embodiments, W0 is substantially less than a minimum length Lmin0 of a majority of the conductors in layer M0 206. In some embodiments, W0 is substantially less than a minimum length Lmin0 of about 80% of the conductors in layer M0 206. In some embodiments, W0 is substantially less than a minimum length Lmin0 of about 85% of the conductors in layer M0 206. In some embodiments, W0≤(≈Lmin0*X/2), where X is a unit of distance (length) measure. In some embodiments, X is contacted poly pitch (CPP) (see FIG. 3A) for the corresponding semiconductor process technology node. In some embodiments, CPP≤(≈66 nm). In some embodiments, CPP≤(≈55 nm). In some embodiments, CPP≤(≈44 nm). In some embodiments, (≈Lmin0*X/6)≤W0≤(≈Lmin0*X/5). In some embodiments, Lmin0≈1.5*CPP. In some embodiments, W0≈(1/3.3)*CPP, or 3W0≈3(1/3.3)*CPP.

In terms of height along the Z-axis, deep via structure 240(1) is substantially taller than via structure 228(1). Accordingly, via structure 228(1) is a shallow via structure in comparison to deep via structure 240(1). In some embodiments, shallow via structure 228(1) is an example of a shallow via structure referred to as an SV. Deep via structure 240(1) has a first aspect ratio AR1 and shallow via structure 228(1) has a second aspect ratio AR2. In some embodiments, the aspect ratio of a structure is defined as the height (along the Z-axis) divided by the width (along the X-axis). The first aspect ratio AR1 is substantially greater than the second aspect ratio AR2. In some embodiments, a quotient Q is Q≈AR1/AR2 and 2 Q≤(≈2). In some embodiments, Q≈AR1/AR2≈10/3. In some embodiments, AR1≈5 and AR2≈1.5.

For a layout diagram (not shown) of the semiconductor process technology node corresponding to the semiconductor device including part 200A, the layout diagram including a level M0 of metallization corresponding to layer M0 206, a design rule for level M0 (M0 design rule) mandates a minimum permissible length LM0 for conductive patterns corresponding to the majority of conductors in layer M0 206, where LM0 corresponds to Lmin0. A conductive pattern having a length less than LM0 violates the M0 design rule. In some embodiments, rather than a deep via pattern which spans levels V0 204, M0 206 and V1 208 (see FIGS. 3C-3F) being regarded in part as representing a conductive pattern in level M0 and thereby being a violation of the M0 design rule, the deep via pattern is not regarded as a conductive pattern in level M0 and thereby avoids violating the M0 rule. In some embodiments, a deep via pattern which spans levels V0 204, M0 206 and V1 208 is tagged in the layout diagram as representing in part an exempt conductive pattern in level M0, wherein such exempt conductive patterns in level M0 are exempted from compliance with the M0 design rule.

Returning to FIG. 2A, in some embodiments, conductor 242(1) represents an input/out conductor (pin) of a corresponding cell region. In some embodiments, a pin is contrasted with an intra-cell-region conductor. A pin is a type of conductor which carries an input/output (I/O) signal of the function of the corresponding cell region. An intra-cell conductor is a type of conductor which carries a signal which is internal to the corresponding cell region. Compared to another approach which uses a conductor in layer M0 206 having a length of at least Lmin0, using instead portion 241(2) of deep via structure 240(1) according to at least some embodiments consumes a substantially smaller area in layer M0 206. A benefit of the smaller area in layer M0 206 which portion 241(2) of deep via structure 240(1) consumes is that congestion in layer M0 206 is improved, which eases the challenge of routing in layer M0 206.

In a primary electrical path having a sequence starting from active region 220(1) and including active region 220 (1), gate structure 224(1), deep via structure 240(1) and conductor 242(1), the use of deep via structure 240(1) avoids otherwise having to include a conductor in layer M0 206 having a length of at least Lmin0, which reduces congestion in layer M0 206.

In some embodiments, given that the first aspect ratio AR1 of deep via structure 240(1) is substantially greater than the second aspect ratio AR2 of shallow via structure 228(1), appropriate material for deep via structure 240(1) is different than for shallow via structure 228(1). In some embodiments, appropriate material for shallow via structure 228(1) includes copper, copper alloy, tungsten, aluminum, gold or the like. In some embodiments, appropriate material for deep via structure 240(1) includes ruthenium, cobalt, or the like.

In some embodiments, deep via structure 240(1) is a supervia described in U.S. patent application Ser. No. 16/530,770, filed Aug. 2, 2019, entitled "Integrated Circuit Including Supervia And Method Of Making" (hereinafter the "1376U application") which is incorporated herein by reference in its entirety.

In FIG. 2A, relative to the X-axis, deep via structure 240(1) is substantially aligned over gate structure 224(1). In some embodiments, relative to the X-axis and the Y-axis (the latter not shown in FIG. 2A), deep via structure 240(1) is substantially aligned over gate structure 224(1). In some embodiments, relative to the X-axis, deep via structure 240(1) does not substantially overlap over gate structure 224(1); rather, gate structure 224(1) is not formed as tall along the Z-axis and a contact structure (not shown), having a long axis substantially parallel to the X-axis is formed between deep via structure 240(1) and gate structure 224(1), thereby electrically coupling deep via structure 240(1) and gate structure 224(1).

Figure 2B:
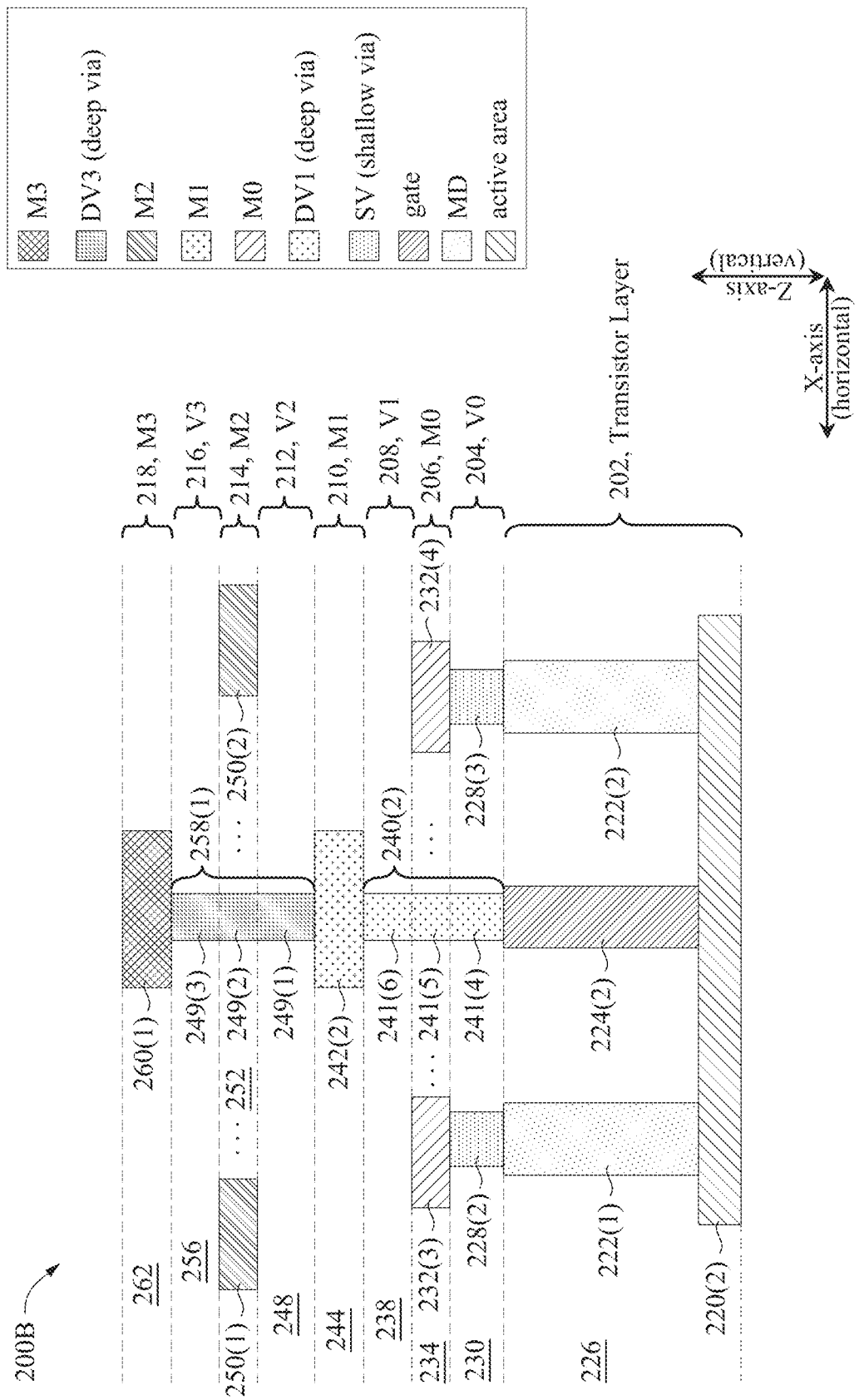

FIG. 2B is a cross-sectional view of a part 200B of a semiconductor device, in accordance with some embodiments.

More particularly, in FIG. 2B, the cross-section of part 200B represents an interconnection architecture that includes deep via structures 240(2) and 258(1). Part 200B and the semiconductor device including the same are corresponding examples of semiconductor device 100 and cell region 104B of FIG. 1.

Part 200B of FIG. 2B is similar to part 200A of FIG. 2A. Like FIG. 2A, in FIG. 2B, the first, second and third directions correspond to the Z-axis, X-axis and Y-axis; in some embodiments, the first, second and third directions correspond to a different orthogonal coordinate system. For brevity, the discussion will focus more on differences between part 200B and part 200A than on similarities. Elements of part 200B which are similar to elements of part 200A share the same main number but differ in parenthetical number, e.g., active region 220(2) in part 200B is similar to active region 220(1) in part 200A. Also, gate structure 224(2) in part 200B is similar to gate structure 224(1) in part 200A. Deep via structure 240(2) in part 200B is similar to deep via structure 240(1) in part 200A. Portions 241(4), 241(5) and 241(6) of deep via structure 240(2) of part 200B are similar to corresponding portions 241(1), 241(2) and 241(3) of deep via structure 240(1) of part 200A.

In part 200B, for purposes of discussion including establishing a context for discussing the interconnection architecture which includes deep via structures 240(2) and 258 (1), transistor layer 202 further includes contacts 222(1) and 222(2), V0 layer 204 further includes shallow via structures 228(2) and 228(3), and M0 layer 206 includes conductors 232(3) and 232(4), and M2 layer 214 includes conductors 250(1) and 250(2).

Relative to the X-axis, shallow via structure 228(2) substantially overlaps MD 222(1), and shallow via structure 228(3) substantially overlaps MD 222(2). Relative to the X-axis, conductor 232(3) substantially overlaps shallow via structure 228(2). Relative to the X-axis, conductor 232(4) substantially overlaps shallow via structure 228(3). Though included in part 200B, nevertheless none of MDs 222(1) and 222(2), shallow via structures 228(2) and 228(3), nor conductors 232(3) and 232(4) represents a part of the interconnection architecture which includes deep via structures 240(2) and 258(1).

Deep via structure 258(1) is located over conductor 242(2). Relative to the Z-axis, deep via structure 258(1) spans V2 layer 212, M2 layer 214 and V3 layer 216. In some embodiments, deep via structure 258(1) is an example of a deep via structure referred to as a DV3 structure. Deep via structure 258(1) includes portions 249(1), 249(2) and 249(3) located correspondingly in V2 layer 212, M2 layer 214 and V3 layer 216. In some embodiments, deep via structure 258(1) is an integral structure. In some embodiments, portions 249(1), 249(2) and 249(3) represent corresponding discrete structures such that deep via structure 258(1) is a composite structure. Portions 249(1), 249(2) and 249(3) represent conductive material in corresponding layers V2 layer 212, M2 layer 214 and V3 layer 216.

Relative to a plane corresponding to the X-axis and the Y-axis (the latter not shown in FIG. 2B), each of deep via structure 258(1) and shallow via structures 228(1) has a substantially square shape. The width W2 (along the X-axis) of deep via structure 258(1) along the X-axis is substantially less than a minimum length Lmin2 of a majority of the conductors in layer M2 214. In some embodiments, W2 is substantially less than minimum length Lmin2 of a majority of the conductors in layer M2 214. In some embodiments, W2 is substantially less than a minimum length Lmin2 of about 80% of the conductors in layer M2 214. In some embodiments, W2 is substantially less than a minimum length Lmin2 of about 85% of the conductors in layer M2 214. In some embodiments, W2≤(≈Lmin2*X/2), where X is a unit of distance (length) measure. In some embodiments, (≈Lmin2*X/6)≤W2≤(≈Lmin2*X/5). In some embodiments, Lmin2≈1.5*CPP. In some embodiments, W2≈(1/3.3)*CPP, or 3W2≈3(1/3.3)*CPP.

In terms of height along the Z-axis, deep via structure 258(1) is substantially taller than a shallow via structure, e.g., a via structure (not shown) in V2 212 or a via structure (not shown) in V3 216. Similar to deep via structure 240(2), deep via structure 258(1) has the first aspect ratio AR1

For a layout diagram (not shown) of the semiconductor process technology node corresponding to the semiconductor device including part 200B, the layout diagram including level M0 of metallization corresponding to layer M0 206 and a level M2 of metallization corresponding to layer M2 214, a M0 design rule is similar to that discussed above in the context of FIG. 2A, and a design rule for level M2 (M2 design rule) mandates a minimum permissible length LM2 for conductive patterns corresponding to the majority of conductors in layer M2 214, where LM2 corresponds to Lmin2. A conductive pattern having a length less than LM2 violates the M2 design rule. In some embodiments, rather than a deep via pattern which spans levels V2 212, M2 214 and V3 216 (see FIGS. 3E-3F) being regarded in part as representing a conductive pattern in level M2 and thereby being a violation of the M2 design rule, the deep via pattern is not regarded as a conductive pattern in level M2 and thereby avoids violating the M2 rule. In some embodiments, a deep via pattern which spans levels V2 212, M2 214 and V3 216 is tagged in the layout diagram as representing in part an exempt conductive pattern in level M2, wherein such exempt conductive patterns in level M2 are exempted from compliance with the M2 design rule.

Returning to FIG. 2B, in some embodiments, conductor 260(1) represents an input/out conductor (pin) of a corresponding cell region. Compared to another approach which uses conductors in layers M0 206 and M2 214 having corresponding lengths of at least Lmin0 and Lmin2, using instead portions 241(5) and 249(2) of corresponding deep via structures 240(2) and 258(1) according to at least some embodiments consume substantially smaller corresponding areas in corresponding layers M0 206 and M2 214. A benefit of the smaller areas in layers M0 206 and M2 214 which corresponding portions 241(5) of deep via structure 240(2) and 249(2) of deep via structure 258(1) consume is that congestion in corresponding layers M0 206 and M0 214 is improved, which eases the challenges of routing in corresponding layers M0 206 and M2 214.

In a primary electrical path having a sequence starting from active region 220(2) and including active region 220(2), gate structure 224(2), deep via structure 240(2), conductor 242(2), deep via structure 258(1) and conductor 260(1), the use of deep via structures 240(2) and 258(1) avoids otherwise having to include conductors in corresponding layers M0 206 and M2 214 having corresponding lengths of at least Lmin0 and Lmin2, which reduces congestion in corresponding layers M0 206 and M2 214.

Materials appropriate for deep via structures 240(2) and 258(1) are similar to the materials appropriate for deep via structure 240(1) of FIG. 2A.

In some embodiments, deep via structure 258(1) is a supervia described in the 1376U application (discussed above).

In FIG. 2B, relative to the X-axis, deep via structures 240(2) and 258(1) are substantially aligned over gate structure 224(2). In some embodiments, relative to the X-axis and the Y-axis (the latter not shown in FIG. 2B), deep via structures 240(2) and 258(1) are substantially aligned over gate structure 224(2). In some embodiments, relative to the X-axis, deep via structure 240(2) does not substantially overlap over gate structure 224(2) nor align with deep via structure 258(1); however, each of deep via structure 240(2) and 258(1) overlaps conductor 242(1), and deep via structure 258(1) substantially overlaps gate structure 224(2). Rather, gate structure 224(2) is not formed as tall along the Z-axis and a contact structure (not shown), having a long axis substantially parallel to the X-axis is formed between deep via structure 240(2) and gate structure 224(2), thereby electrically coupling deep via structure 240(2) and gate structure 224(2).

In some embodiments, relative to the X-axis, deep via structure 258(1) does not substantially overlap over gate structure 224(2) nor substantially aligns with deep via structure 240(2); however each of deep via structure 240(2) and 258(1) overlaps conductor 242(1), deep via structure 240(2) substantially overlaps gate structure 224(2), and deep via structure 258(1) substantially overlaps conductor 260(1). In some embodiments, relative to the X-axis, neither of deep via structures 240(2) and 258(1) substantially overlaps over gate structure 224(2); however deep via structure 258(1) is substantially aligned over deep via structure 240(2), each of deep via structure 240(2) and 258(1) overlaps conductor 242(1), and deep via structure 258(1) substantially overlaps conductor 260(1). In some embodiments, relative to the X-axis, neither of deep via structures 240(2) and 258(1) substantially overlaps over gate structure 224(2), nor does deep via structure 258(1) substantially align over deep via structure 240(2); however each of deep via structure 240(2) and 258(1) overlaps conductor 242(1), and deep via structure 258(1) substantially overlaps conductor 260(1).

FIGS. 3A-3F are corresponding layout diagrams 300A-300F, in accordance with some embodiments.

Figure 4A:
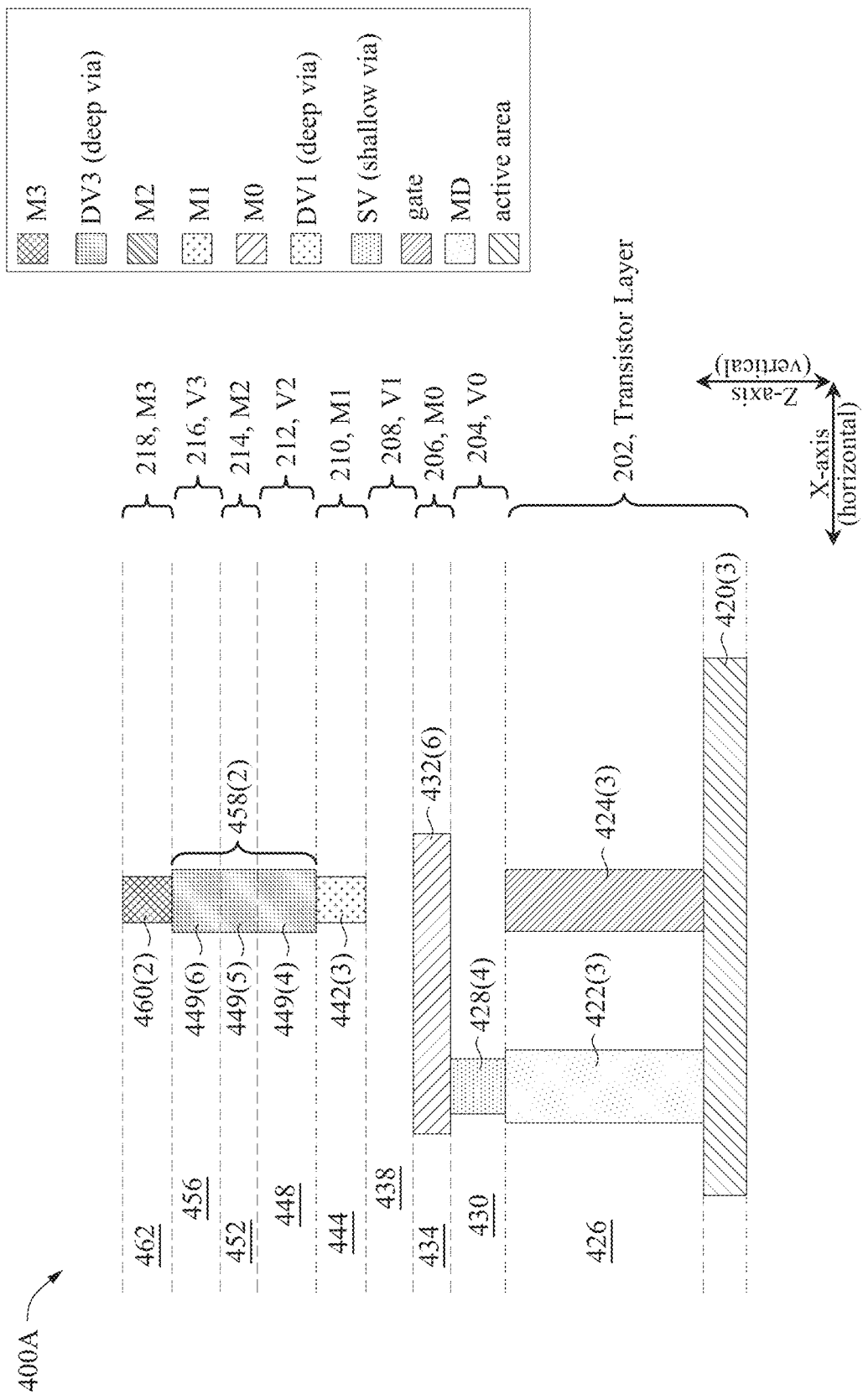
FIGS. 4A-4B are corresponding cross-sectional views, in accordance with some embodiments.
Figure 4B:
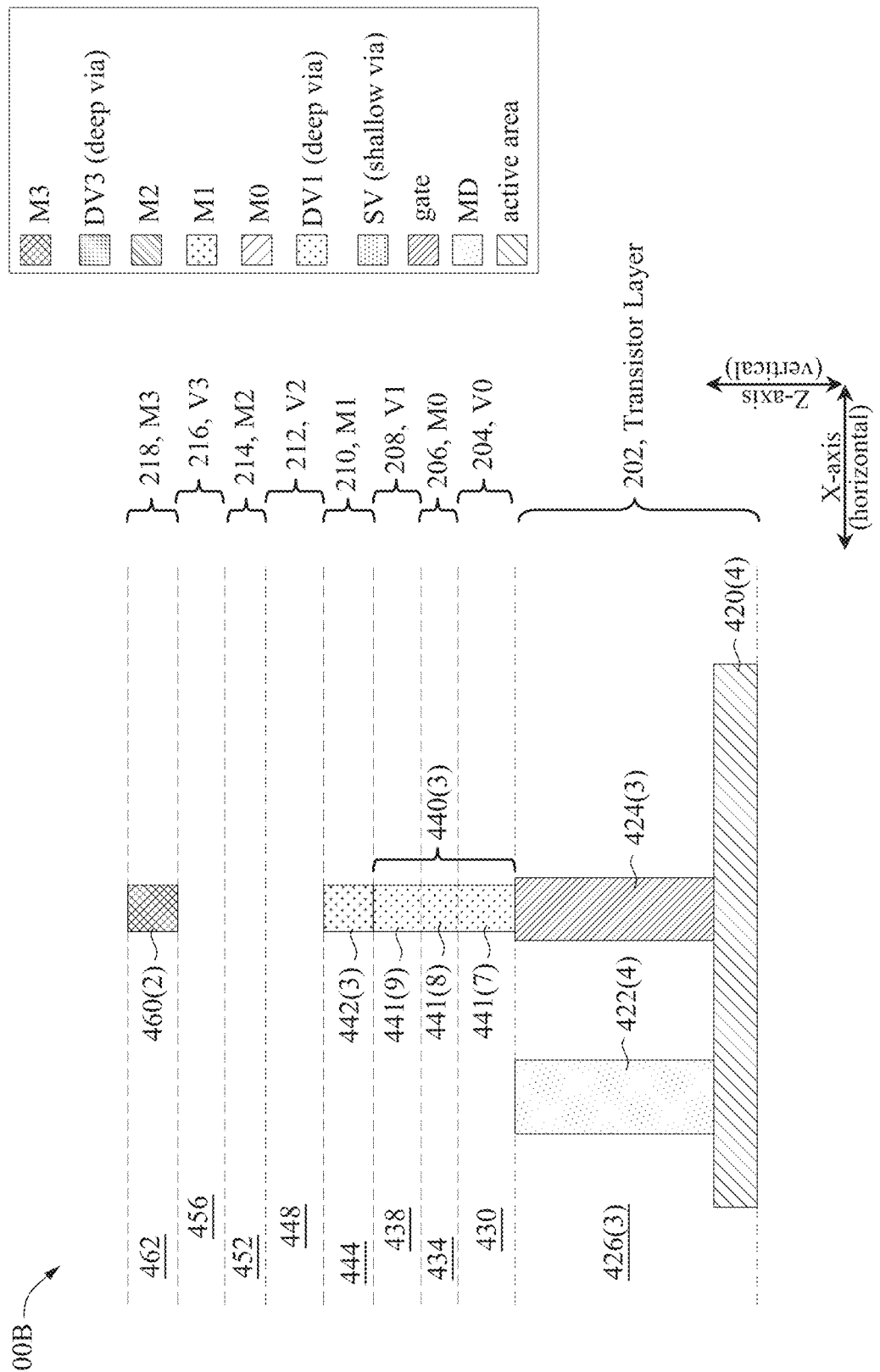

FIGS. 4A-4B are corresponding cross-sectional views of parts 400A-400B, in accordance with some embodiments.

More particularly, layout diagrams 300A-300F are corresponding layout diagrams of corresponding standard cells 301A-301F which provide an AND-OR-INVERT (AOI) function. Each of layout diagrams 300B and 300C add corresponding patterns relative to layout diagram 300A. Layout diagram 300D adds patterns relative to layout diagram 300C. Layout diagram 300E adds patterns relative to layout diagram 300D. Layout diagram 300F adds patterns relative to layout diagram 300E. A semiconductor device based on one or more of layout diagram 300F includes a cell region which represents an AOI circuit. In some embodiments, standard cell 301F of layout diagram 300F is referred to as an AOI22 cell, where the 22 denotes a two-input AND-function and a two-input OR function. An example of a semiconductor device based on layout diagram 300F is semiconductor device 100 of FIG. 1.

Also more particularly, parts 400A-400B in FIGS. 4A-4B are parts of a semiconductor device based on layout diagram 300F. Accordingly, FIGS. 3A-3F and 4A-4B will be discussed together.

Figure 3D:
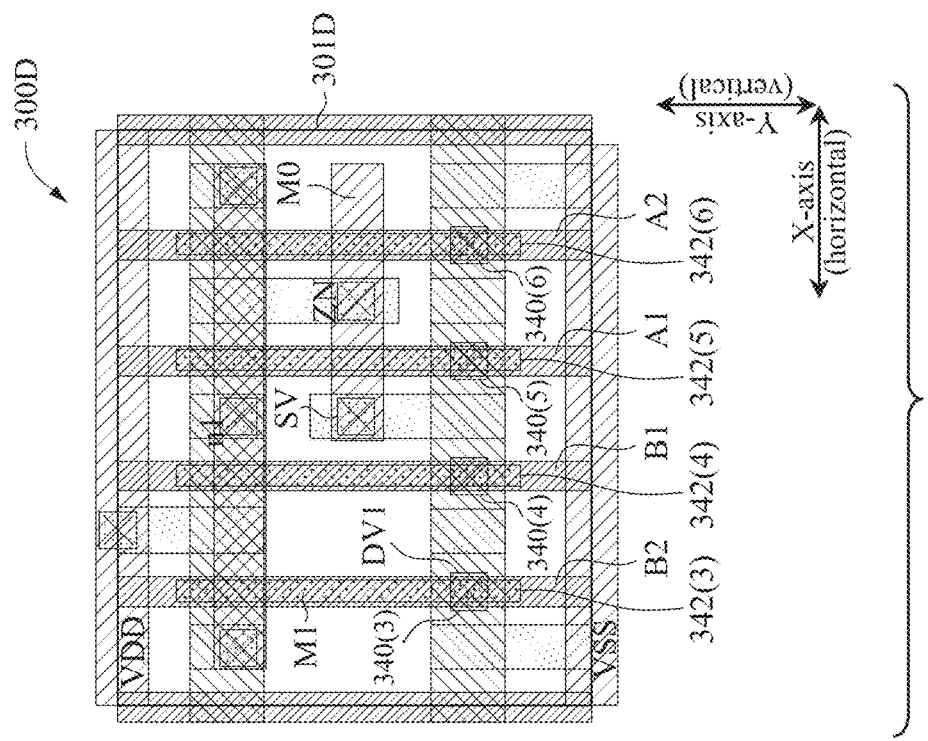

The numbering convention of FIGS. 3A-3F reflects that a semiconductor device based on one or more of layout diagrams 300A-300F includes structures which are similar to structures in FIGS. 2A-2B. While elements in FIGS. 3A-3E use 3-series numbering and elements of FIGS. 2A-2B use 2-series numbering, a similarity between an element in FIGS. 3A-3E and corresponding elements in FIGS. 2A-2B is reflected in the use of a similar main portion of the reference number, with the difference being reflected in the parenthetical portion of the reference number. For example, active area pattern 320(3) of FIG. 3A represents an active region in a semiconductor device based on layout diagram 300A which is similar to active regions 220(1) of FIG. 2A and 220(2) of FIG. 2B. Here, the similarity is reflected in the main portion "X20" of the reference number, where X=3 for 320(3) of FIG. 3A and X=2 for 220(1) of FIG. 2A and 220(2) of FIG. 2B. Also, here, differences are reflected in the parenthetical portion (3) for 320(3) of FIG. 3A as contrasted with (1) for 220(1) of FIG. 2A and 220(2) of FIG. 2B.

Likewise, the numbering convention of FIGS. 4A-4B reflects that parts 400A-400B of corresponding FIGS. 4A-4B include structures which are similar to structures in FIGS. 2A-2B. While elements in FIGS. 4A-4B use 4-series numbering and elements of FIGS. 2A-2B use 2-series numbering, a similarity between an element in FIGS. 4A-4B and corresponding elements in FIGS. 2A-2B is reflected in the use of a similar main portion of the reference number, with the difference being reflected in the parenthetical portion of the reference number. For example, active region 420(4) of FIG. 4B is similar to active region 220(1) of FIG. 2A. Here, the similarity is reflected in the main portion "X20" of the reference number, where X=4 for 420(4) of FIG. 4B and X=2 for 220(1) of FIG. 2A. Also, here, differences are reflected in the parenthetical portion (4) for 420(4) of FIG. 4B as contrasted with (1) for 220(1) of FIG. 2A.

The numbering convention of FIGS. 4A-4B also reflects that corresponding parts 400A-400B are included in a semiconductor device based on layout diagram 300F. While elements in FIGS. 4A-4B use 4-series numbering and elements of FIGS. 3A-3E use 3-series numbering, a similarity between an element in FIGS. 4A-4B and corresponding element in FIGS. 3A-3E is reflected in the use of a similar main portion of the reference number and a similar parenthetical portion of the reference number. For example, active area pattern 320(3) of FIG. 3A represents active region 420(3) in part 200A. Here, the similarity is reflected in the main portion "X20" of the reference number, where X=3 for 320(3) of FIG. 3A and X=4 for 420(3) of FIG. 4A, and in the parenthetical portion (3) for 320(3) of FIG. 3A and (3) for 420(3) of FIG. 4A.

FIGS. 3A-3E assume an orthogonal XYZ coordinate system in which the X-axis, Y-axis and Z-axis represent corresponding first, second and third directions. In some embodiments, the first, second and third directions correspond to a different orthogonal coordinate system than the XYZ coordinate system.

In FIG. 3A, layout diagram 300A includes: active area patterns 320(3) (as alluded to above) and 320(4); MD patterns 322(3), 322(4), 322(5), 322(6), 322(7), 322(8), 322(9), 322(10), 322(11) and 322(12); gate patterns 324(3), 324(4), 324(5), 434(6), 324(7) and 324(8); shallow via patterns 328(4), 328(5), 328(6), 328(7), 328(8) and 328(9); and conductive patterns 332(5), 332(6), 332(7) and 332(8). Conductive patterns 332(5) and 332(8) are designated for first and second reference voltages, which are correspondingly voltages VDD and VSS in FIGS. 3A-3F. In some embodiments, conductive patterns 332(5) and 332(8) are designated for first and second reference voltages other than correspondingly voltages VDD and VSS.

Active area patterns 320(3)-320(4), MD patterns 322(3)-322(12), and gate patterns 324(3)-324(8) are included in a transistor level of layout diagrams 300A-300E, where the transistor level represents a transistor layer in a semiconductor device based on one or more of layout diagrams 300A-300E. Active region 420(3) of FIG. 4A is an example of an active region in a semiconductor device based on active area pattern 320(3) in layout diagram 300F.

Shallow via patterns 328(4)-328(9) are included in a V0 level of layout diagrams 300A-300F, where the V0 level represents a V0 layer in a semiconductor device based on one or more of layout diagrams 300A-300F. Shallow via structure 428(4) is an example of a shallow via structure based on shallow via pattern 328(4) in layout diagram 300F.

Conductive patterns 332(5), 332(6), 332(7) and 332(8) are included in a M0 level of layout diagrams 300A-300F, where the M0 level represents a M0 layer in a semiconductor device based on layout diagrams 300A-300F. Conductor 432(6) in FIG. 4A is an example of a conductor based on conductive pattern 332(6) in layout diagram 300F.

In FIG. 3A, active area patterns 320(3)-320(4) have corresponding long axes extending substantially along the X-axis (extending horizontally). MD patterns 322(3)-322(12), and gate patterns 324(3)-324(8) are disposed over corresponding active area patterns 320(3)-320(4), and have corresponding long axes extending substantially along the Y-axis (extending vertically). Relative to the X-axis, MD patterns 322(3)-322(12) are interspersed amongst corresponding gate patterns 324(3)-324(8).

Shallow via patterns 328(4)-328(9) are disposed over corresponding MD patterns 322(3), 322(4), 322(5), 322(7), 322(10) and 322(6). Conductive patterns 332(5), 332(6), 332(7) and 332(8) are disposed over corresponding MD patterns 322(3)-322(12), and gate patterns 324(4), 324(5), 434(6) and 324(7), and have corresponding long axes extending substantially along the X-axis (extending horizontally).

Relative to the X-axis gate patterns 324(3)-324(8) are separated by a distance representing one CPP, e.g., gate patterns 324(6) and 324(7) are separated by one CPP. Accordingly, relative to the X-axis, a width CW301A of cell 301A is CW301A=5 CPP.

As cell 301A is an AOI cell, cell 301A has inputs A1, A2, B1 and B2, an output ZN, and an internal node n1. Gate patterns 324(4)-324(7) are designated to receive corresponding inputs A1, A2, B1 and B2. MD pattern 322(6) is designated to provide output ZN.

In some embodiments, a first M0 design rule for layout diagrams 300A-300F is the M0 design rule discussed above, for which LM0≈1.5*CPP. In some embodiments, relative to the X-axis, a second M0 design rule is that ends of neighboring and otherwise-abutting conductive patterns must be separated by a gap having a size G0. In some embodiments, G0≈0.5CPP. In some embodiments, where CPP≤(≈66 nm), G0≤(≈33 nm). In some embodiments, where CPP≤(≈55 nm), G0≤(≈22.5 nm). In some embodiments, where CPP≤(≈44 nm), G0≤(≈22 nm). If shallow via patterns were to be used to diagrammatically couple gate patterns 324(4)-324(7) to corresponding conductive patterns in level M0, and in order to comply with the first and second M0 design rules, then cell 301A is widened by one CPP resulting in cell 301B of FIG. 3B, where the increase in width is noted by reference numeral 370 in FIG. 3B. Cell 301B is widened due to congestion in level M0.

In layout diagram 300B of FIG. 3B, patterns have been added relative to layout diagram 300A of FIG. 3A. In particular, due to congestion in level M0, gate pattern 324(9), MD patterns 322(13)-322(14), shallow via patterns 328(10), 328(11), 328(12), 328(13), 328(14) and 328(15), and conductive patterns 332(9), 332(10) and 332(11) have been added in order to comply with the first and second M0 design rules. Also, relative to the X-axis, conductive pattern 332(7)' has been widened in cell 301B as contrasted with conductive pattern 332(7) of cell 301A. As a result, a width CW301B of cell 301B being CW301B=6 CPP. Cell 301B is increased in width by about 20% as compared to cell 301A.

Cell 301B of FIG. 3B does not reflect an interconnection architecture (according to at least some embodiments) which includes a deep via pattern. To relieve congestion in level M0, and in order to comply with the first and second M0 design rules, and yet to avoid a resultant cell which is wider than cell 301A, cell 301C of layout diagram 300C adds a different set of patterns to cell 301A of layout diagram 300A than are added by cell 301B of layout diagram 300B.

Figure 3C:
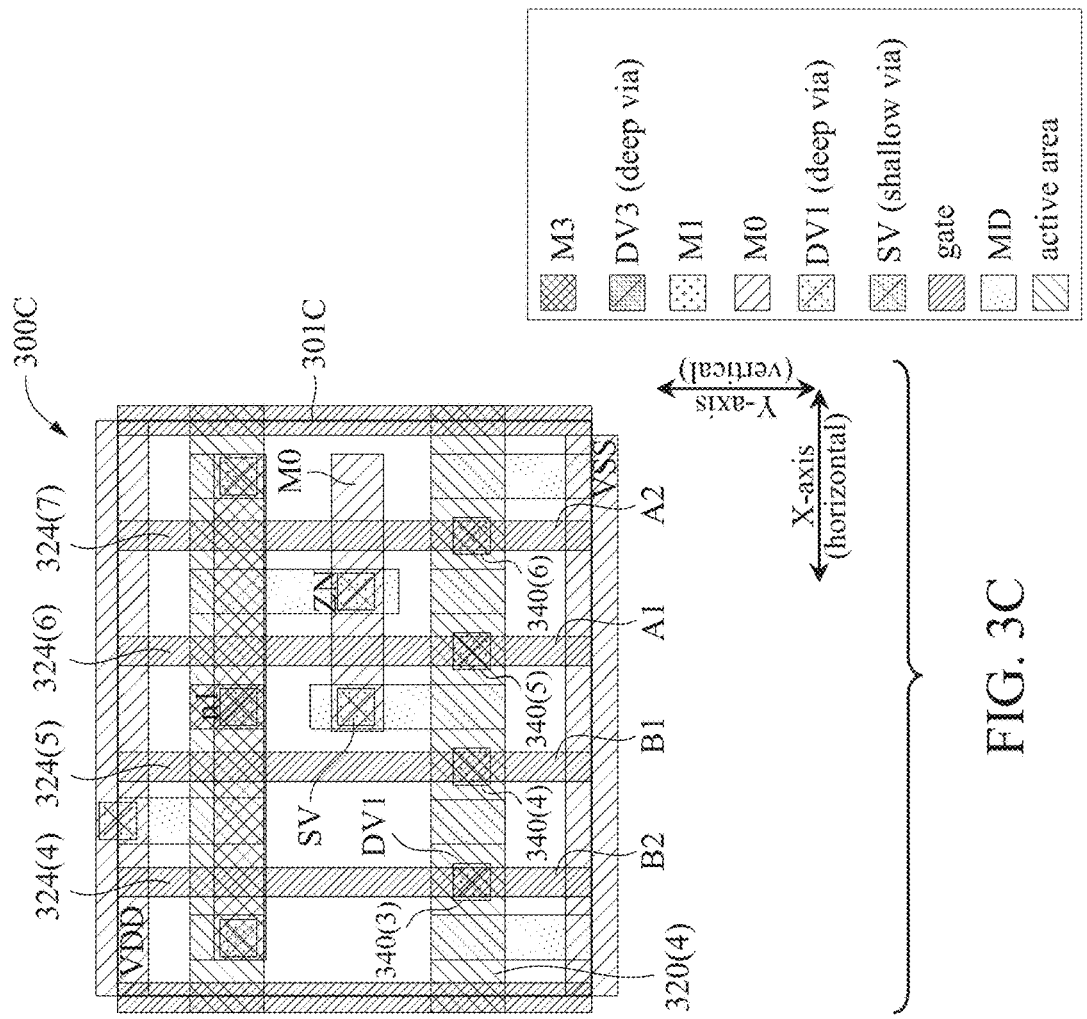

In FIG. 3C, cell 301C of layout diagram 300C reflects an interconnection architecture (according to at least some embodiments) which includes at least one deep via pattern. Similarly, cells 301D-301F of corresponding layout diagrams 300D-300F reflect corresponding interconnection architectures (according to at least some embodiments) which include at least one deep via pattern.

More particularly, in FIG. 3C, deep via patterns representing corresponding DV1 structures, namely deep via patterns 340(3), 340(4), 340(5) and 340(6), have been added to cell 301C. In some embodiments, relative to the X-axis, a size D0 of each of deep via patterns 340(3)-340(6) is D0≤(≈LM0*X/2), where X is a unit of distance (length) measure, and D0 corresponds to W0 (see FIG. 2A). In some embodiments, (≈LM0*X/6)≤D0≤(≈LM0*X/5). In some embodiments, LM0≈1.5*CPP. In some embodiments, D0≈(1/3.3)*CPP, or 3D0≈3(1/3.3)*CPP. Each of deep via patterns 340(3)-340(6) represent conductive material correspondingly included in V0 layer 204, M0 layer 206 and V1 layer 208 of a semiconductor device based on layout diagrams 300C-300F. Deep via structure 440(3) of FIG. 4B is an example of a deep via structure based on deep via pattern 340(3) in layout diagram 300C. Deep via structure 440(3) includes portions 441(7), 441(8) and 441(9) in corresponding V0 layer 204, M0 layer 206 and V1 layer 208. Relative to the X-axis, deep via patterns 340(3)-340(6) have been disposed to overlap corresponding gate patterns 324(4)-324(7). Relative to the Y-axis, deep via patterns 340(3)-340(6) have been disposed to overlap active area pattern 320(4).

In FIG. 3D, conductive patterns 342(3), 342(4), 342(5) and 342(6) have been added to cell 301D. Conductive patterns 342(3), 342(4), 342(5) and 342(6) are included in a M1 level of layout diagrams 300D-300F, where the M1 level represents a M1 layer in a semiconductor device based on layout diagrams 300D-300F. Conductor 442(3) in FIGS. 4A-4B is an example of a conductor based on conductive pattern 342(3) in layout diagram 300F.

Conductive patterns 342(3)-342(6) are disposed over corresponding deep via patterns 340(3)-340(6) and gate patterns 324(4)-324(7), and have corresponding long axes extending substantially along the Y-axis (extending vertically). Relative to the X-axis, conductive patterns 342(3)-342(6) substantially overlap corresponding deep via patterns 340(3)-340(6).

In some embodiments, a first M2 design rule for layout diagrams 300D-300F is the M2 design rule discussed above, for which LM2≈1.5*CPP. In some embodiments, relative to long axes of conductive patterns in level M2, a second M2 design rule is that ends of neighboring and otherwise-abutting conductive patterns must be separated by a gap having a size G2. In some embodiments, to relieve congestion in level M2, and in order to comply with the first and second M2 design rules, deep via patterns representing corresponding DV3 structures are added to cell 301E of FIG. 3E.

In FIG. 3E, more particularly, deep via patterns 358(2), 358(3), 358(4) and 358(5) have been added to cell 301D. In some embodiments, relative to the X-axis, a size D2 of each of deep via patterns 358(2)-358(5) is D2≤(≈LM2*X/2), where D2 corresponds to W2 (see FIG. 2B). In some embodiments, (≈LM2*X/6)≤D2≤(≈LM2*X/5). In some embodiments, LM2≈1.5*CPP. In some embodiments, D2≈(1/3.3)*CPP, or 3D2≈3(1/3.3)*CPP. Each of deep via patterns represent conductive material correspondingly included in V2 layer 212, M2 layer 214 and V3 layer 216 of a semiconductor device based on layout diagrams 300E-300F. Deep via structure 458(2) of FIG. 4A is an example of a deep via structure based on deep via pattern 358(2) in layout diagram 300E. Deep via structure 458(2) includes portions 449(4), 449(5) and 449(6) in corresponding V2 layer 212, M2 layer 214 and V3 layer 216. Relative to the X-axis, deep via patterns 358(2)-358(5) have been disposed to overlap corresponding conductive patterns 342(3)-342(6). Relative to the Y-axis, deep via patterns 340(3)-340(6) have been disposed to overlap active area pattern 320(3).

In FIG. 3F, conductive patterns 360(2), 360(3), 360(4) and 360(5) have been added to cell 301F. Conductive patterns 360(2)-360(5) are included in an M3 level of layout diagram 300F, where the M3 level represents a M3 layer in a semiconductor device based on layout diagram 300F. Conductor 460(2) in FIGS. 4A-4B is an example of a conductor based on conductive pattern 360(2) in layout diagram 300F.

Conductive patterns 360(2)-360(5) are disposed over corresponding deep via patterns 358(2)-358(5) and conductive patterns 342(3)-342(6), and have corresponding long axes extending substantially along the Y-axis (extending vertically). Relative to the X-axis, conductive patterns 360(2)-360(5) substantially overlap corresponding deep via patterns 358(2)-358(5).

Cells 301C-301F of FIGS. 3C-3F reflect an interconnection architecture (according to at least some embodiments) which includes at least one deep via pattern. Using such an architecture, cells 301C-301F relieve congestion in level M0 while complying with the first and second M0 design rules, and while retaining a cell width that is no wider than cell 301A. Compared to cell 301B, each of cells 301C-301F is about 20% narrower. Also, using such an architecture, cells 301E-301F relieve congestion in level M2 while complying with the first and second M2 design rules, and while retaining a cell width that is no wider than cell 301A. Compared to cell 301B, each of cells 301E-301F is about 20% narrower.

In FIG. 3F, AOI22 cell 301F is an example of a high pin-count cell which suffers congestion in level M0 and/or level M2, and which benefits from using an interconnection architecture (according to at least some embodiments) which includes at least one deep via pattern. Examples of other high pin-count standard cells that similarly benefit from using an interconnection architecture (according to at least some embodiments, which includes at least one deep via pattern) include: AOI 33, AOI44, or the like; OR-AND-INVERT (OAI) cells such as OAI22, OAI33, OAI44, or the like; NAND4, NAND5, or the like; NOR4, NOR5, or the like.

FIG. 5 is a flowchart of a method 500 of manufacturing a semiconductor device, in accordance with one or more embodiments.

Examples of a semiconductor device which can be manufactured according to method 500 include semiconductor device 100 FIG. 1, and the semiconductor devices for which parts 200A of FIG. 2A, 200B of FIG. 2B, 400A of FIGS. 4A and 400B of FIG. 4B are correspondingly included therein, or the like.

In FIG. 5, method 500 includes blocks 502-504. At block 504, a layout diagram is generated which reflects an interconnection architecture (according to at least some embodiments) which includes at least one deep via pattern. Block 502 is discussed in more detail below with respect to FIGS. 6A-6B. From block 502, flow proceeds to block 504.

At block 504, based on the layout diagram, at least one of (A) one or more semiconductor masks or (B) at least one component in a layer of a semiconductor device is fabricated. See discussion below of FIG. 8. In some embodiments, the fabricating further includes performing one or more lithographic exposures based on the revised layout diagram.

Figure 6A:
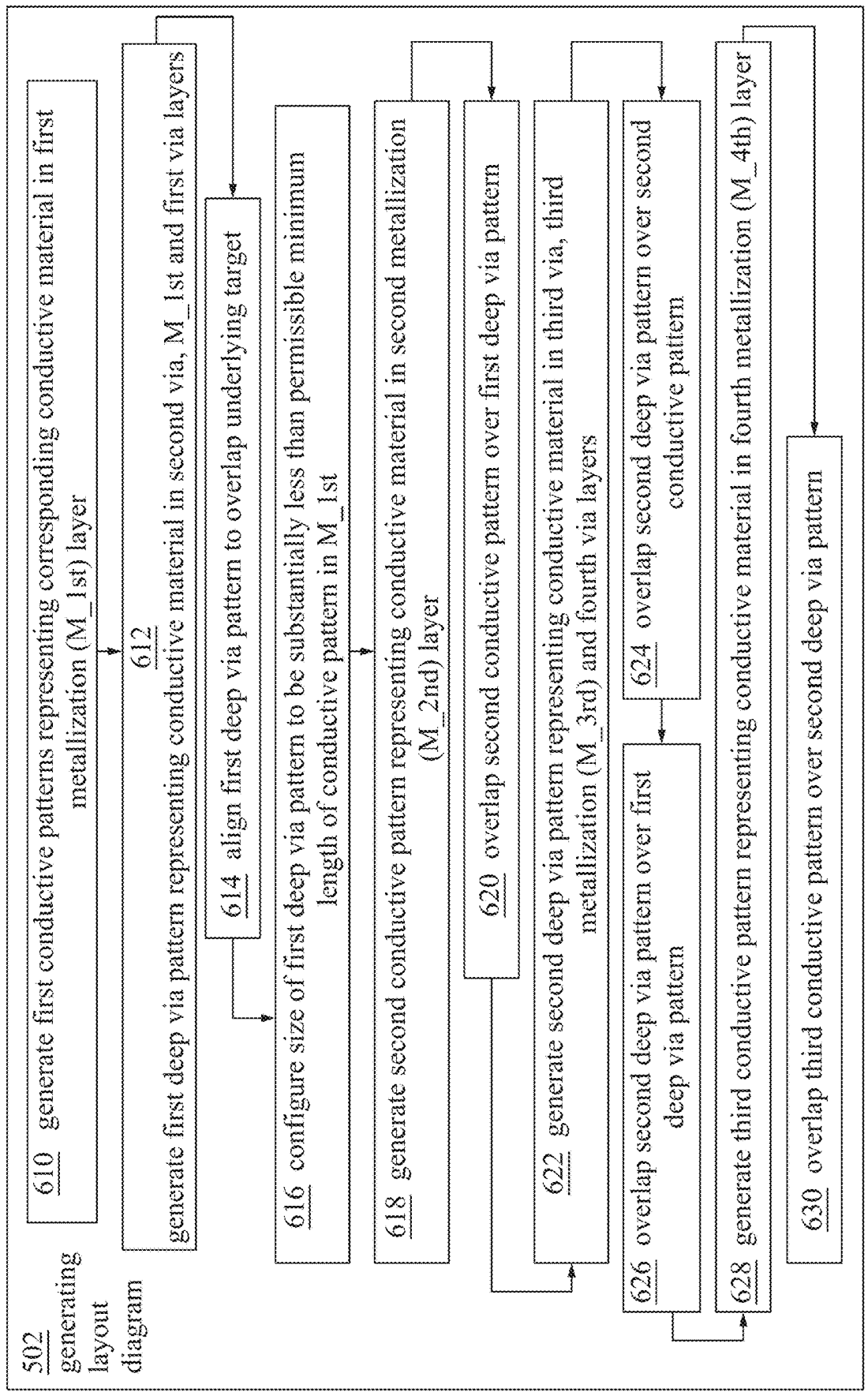
FIGS. 6A-6B are corresponding flowcharts of corresponding methods, in accordance with some embodiments.

FIG. 6A is a flowchart of a method of generating a layout diagram, in accordance with one or more embodiments.

More particularly, the method of FIG. 6A shows block 502 of FIG. 5 in more detail, in accordance with one or more embodiments.

Examples of layout diagrams which can be generated according to the method of FIG. 6A include the layout diagrams disclosed herein, or the like. In some embodiments, the layout diagram and versions thereof are stored on a non-transitory computer-readable medium, e.g., stored as layout diagram(s) 708 in computer-readable medium 704 in FIG. 7 (discussed below). The method of FIG. 6A is implementable, for example, using an electronic design automation (EDA) system 700 (FIG. 7, discussed below), in accordance with some embodiments. Examples of a semiconductor device which can be manufactured based on layout diagrams generated according to the method of FIG. 6A include semiconductor device 100 FIG. 1, and the semiconductor devices for which parts 200A of FIG. 2A, 200B of FIG. 2B, 400A of FIGS. 4A and 400B of FIG. 4B are correspondingly included therein, or the like.

In FIG. 6A, block 502 includes blocks 610-630. At block 610, first conductive patterns are generated which represent corresponding conductive material in a first metallization (M_1st layer) of a semiconductor device. An example of the M_1st layer is layer M0 206 in FIGS. 4A-4B, which corresponds to level M0 in the layout diagram. Examples of the first conductive patterns include conductive patterns 332(5)-332(8) of FIGS. 3A-3F. From block 610, flow proceeds to block 612.

At block 612, a first deep via pattern is generated which represents conductive material in the second via layer, M_1st layer, and first via layer of a semiconductor device. Examples of the first and second via layers are corresponding layers V0 204 and V1 208 in FIGS. 4A-4B. Examples of the first deep via pattern are deep via patterns 340(3), 340(4), 340(5) and 340(6) of FIGS. 3C-3F. From block 612, flow proceeds to block 614.

At block 614, the first deep via pattern is aligned to overlap an underlying target. An example of the target is a corresponding component pattern representing conductive material included in an electrical path of a terminal of a corresponding transistor in the transistor layer. Other examples of the target are gate patterns 324(4)-324(7) in FIGS. 3C-3F. From block 614, flow proceeds to block 616.

At block 616, the size of the deep via pattern is configured to be substantially less than a permissible minimum length of a conductive pattern in level M_1st. Examples of the size of the deep via pattern being less than the permissible minimum length of a conductive pattern in level M_1st include the size D0 of each of deep via patterns 340(3)-340(6) in FIGS. 3C-3D being D0≤(≈LM0*X/2). From block 616, flow proceeds to block 618.

At block 618, a conductive pattern is generated which represents conductive material in the second metallization (M_2nd) layer of a semiconductor device. An example of the M_2nd layer is layer M1 210 in FIGS. 4A-4B, which corresponds to level M1 in the layout diagram. Examples of the second conductive pattern include conductive patterns 342(3)-342(6) of FIGS. 3D-3F. From block 618, flow proceeds to block 620.

At block 620, the second conductive pattern is aligned to overlap the first deep via pattern. Examples of the second conductive pattern being aligned to overlap the first deep via pattern include conductive patterns 342(3)-342(6) of FIGS. 3D-3F being aligned to overlap corresponding deep via patterns 340(3)-340(6). From block 620, flow proceeds to block 622.

At block 622, a second deep via pattern is generated which represents conductive material in the third via layer, M_3rd layer, and fourth via layer of a semiconductor device. Examples of the third and fourth via layers are corresponding layers V2 212 and V3 216 in FIGS. 4A-4B. Examples of the second deep via pattern are deep via patterns 358(2)-358(5) of FIGS. 3E-3F. From block 622, flow proceeds to block 624.

At block 624, the second deep via pattern is aligned to overlap the second conductive pattern. Examples of the second deep via pattern being aligned to overlap the second conductive pattern include deep via patterns 358(2)-358(5) being aligned to overlap corresponding conductive patterns 342(3)-342(6) as in FIGS. 3E-3F. From block 624, flow proceeds to block 626.

At block 626, the second deep via pattern is aligned to overlap the first deep via pattern. Examples of the second deep via pattern being aligned to overlap the first deep via pattern include deep via patterns 358(2)-358(5) being aligned to overlap corresponding deep via patterns 340(3)-340(6), relative to the Y-axis, as in FIGS. 3E-3F. In some embodiments, the second deep via pattern is aligned to overlap the first deep via pattern with respect to each of the X-axis and the Y-axis. From block 626, flow proceeds to block 628.

At block 628, a third conductive pattern is generated which represents conductive material in the fourth metallization (M_4th) layer of a semiconductor device. An example of the M_4th layer is layer M3 218 in FIGS. 4A-4B, which corresponds to level M3 in the layout diagram. Examples of the third conductive pattern include conductive patterns 360(2)-360(5) of FIG. 3F. From block 628, flow proceeds to block 630.

At block 630, the third conductive pattern is aligned to overlap the second deep via pattern. Examples of the second conductive pattern being aligned to overlap the second deep via pattern include conductive patterns 360(2)-360(5) of FIG. 3F being aligned to overlap corresponding deep via patterns 358(2)-358(5).

Figure 6B:
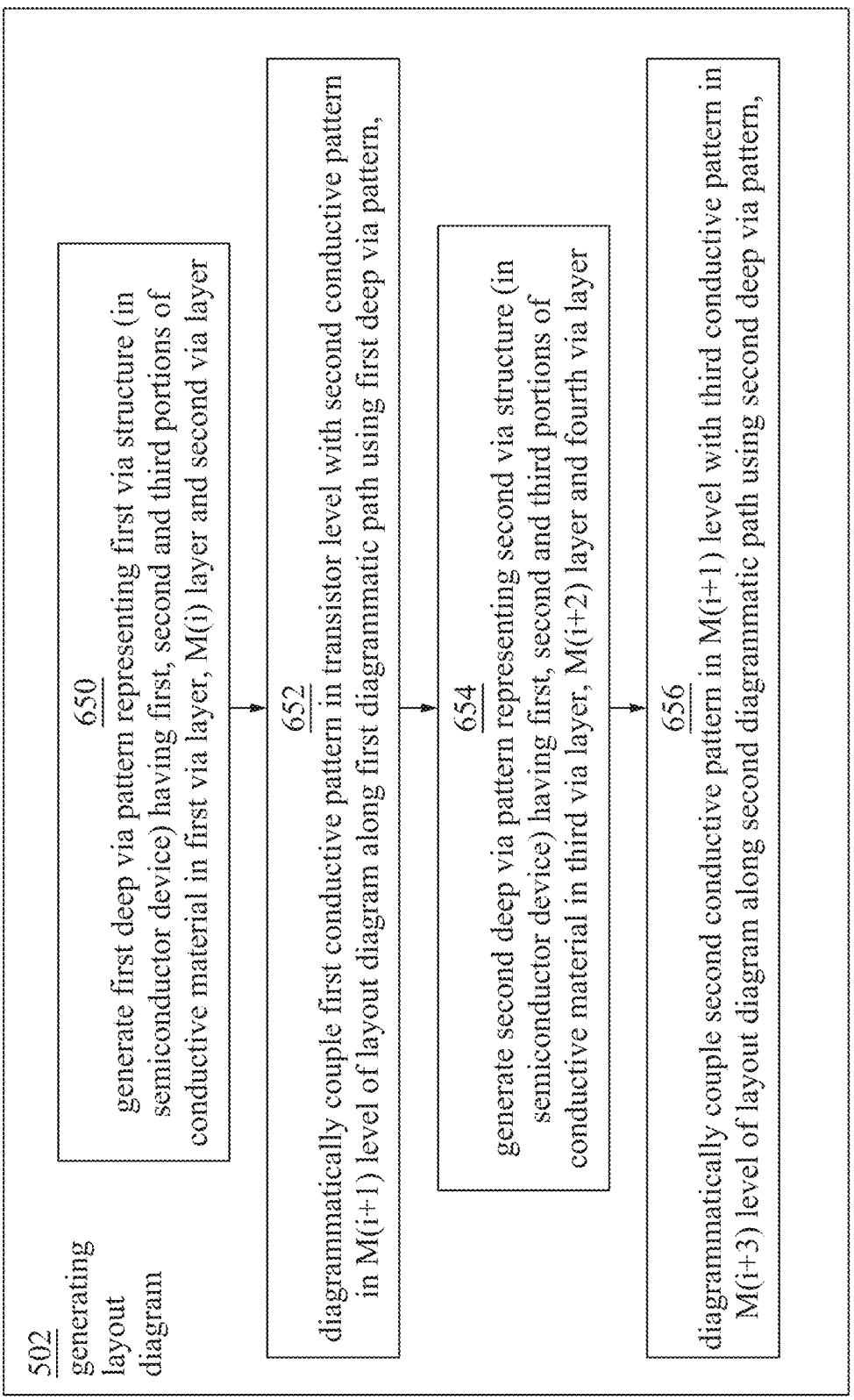

FIG. 6B is a flowchart of a method of generating a layout diagram, in accordance with one or more embodiments.

More particularly, the method of FIG. 6B shows block 502 of FIG. 5 in more detail, in accordance with one or more embodiments.

Examples of layout diagrams which can be generated according to the method of FIG. 6B include the layout diagrams disclosed herein, or the like. In some embodiments, the layout diagram and versions thereof are stored on a non-transitory computer-readable medium, e.g., stored as layout diagram(s) 708 in computer-readable medium 704 in FIG. 7 (discussed below). The method of FIG. 6B is implementable, for example, using EDA system 700 (FIG. 7, discussed below), in accordance with some embodiments. Examples of a semiconductor device which can be manufactured based on layout diagrams generated according to the method of FIG. 6B include semiconductor device 100 FIG. 1, and the semiconductor devices for which parts 200A of FIG. 2A, 200B of FIG. 2B, 400A of FIGS. 4A and 400B of FIG. 4B are correspondingly included therein, or the like.

In FIG. 6B, block 502 includes blocks 650-656. At block 650, a first deep via pattern is generated which represents a first via structure in a semiconductor device, the first via structure having first, second and third portions of conductive material in the first via layer, M(i) layer, and second via layer of a semiconductor device, where i is an integer and 0≤i. Examples of the first and second via layers are corresponding layers V0 204 and V1 208 in FIGS. 4A-4B. An example of the M(i) layer is M0 layer 206 in FIGS. 4A-4B. An example of the first deep via pattern is deep via pattern 340(3) in FIGS. 3C-3F. An example of a corresponding deep via structure is deep via structure 440(3) in FIG. 4B. Deep via structure 440(3) includes portions 441(7), 441(8) and 441(9) in corresponding layers V0 204, M0 206 and V1 208. From block 650, flow proceeds to block 652.

At block 652, a first conductive pattern in the transistor level of the layout diagram is diagrammatically coupled (through a first diagrammatic path) with a second conductive pattern in a M(i+1) level of the layout diagram using the first deep via pattern. The first diagrammatic path represents a first primary electrical path in the semiconductor device.

The first primary electrical path uses a first deep via structure to electrically couple a first conductive structure in the transistor layer with a second conductive structure in the layer M(i+1). Examples of the first and second conductive structures are correspondingly gate pattern 324(3) in the transistor level and conductive pattern 342(3) in corresponding FIGS. 3D-3F. Examples of corresponding first and second conductive structures include gate structure 424(3) and conductor 442(3) in FIG. 4B.

The first deep via pattern, if otherwise regarded in part as representing a conductive pattern in the M(i) level which corresponds to the second portion in the M(i) layer, then would be short enough to violate a minimum length design rule for a permissible conductive pattern in the M(i) level. An example of the M(i) level is the M0 level of the layout diagram, which corresponds to the M0 layer of a semiconductor device. An example of the M0 layer of a semiconductor device is M0 layer 206 of FIGS. 4A-4B. An example of the minimum length design rule for a permissible conductive pattern in the M(i) level is the first M0 design rule (discussed above), which has minimum length LM0. An example of the first deep via pattern, if otherwise regarded in part as representing a conductive pattern in the M(i) level, then being be short enough to violate the minimum length design rule for a permissible conductive pattern in the M(i) level, is deep via pattern 340(3) of FIGS. 3C-3F having, relative to the X-axis, size D0, where D0≤(≈LM0*X/2) in some embodiments. Again, in some embodiments, (≈LM0*X/6)≤D0≤(≈LM0*X/5). From block 652, flow proceeds to block 654.

At block 654, a second deep via pattern is generated which represents a second via structure in a semiconductor device, the second via structure having first, second and third portions of conductive material in the third via layer, M(i+2) layer, and fourth via layer of a semiconductor device. Examples of the third and fourth via layers are corresponding layers V2 212 and V3 216 in FIGS. 4A-4B. An example of the M(i+1) layer is M1 layer 210 in FIGS. 4A-4B. An example of the first deep via pattern is deep via pattern 358(2) in FIGS. 3E-3F. An example of a corresponding deep via structure is deep via structure 458(2) in FIG. 4A. Deep via structure 458(2) includes portions 449(4), 449(5) and 449(6) in corresponding layers V2 212, M2 214 and V3 216. From block 654, flow proceeds to block 656.

At block 656, a second conductive pattern in the M(+1) level of the layout diagram is diagrammatically coupled (through a second diagrammatic path) with a third conductive pattern in a M(i+3) level of the layout diagram using the second deep via pattern. The second diagrammatic path represents a second primary electrical path in the semiconductor device.

The second primary electrical path uses a second deep via structure to electrically couple the second conductive structure in the M(i+1) layer with the third conductive structure in the layer M(i+3). Examples of the second and third conductive patterns are correspondingly conductive pattern 342(3) and conductive pattern 360(2) in FIG. 3F. Examples of corresponding second and third conductive structures conductors 442(3) and 460(2) in FIG. 4A.

The second deep via pattern, if otherwise regarded in part as representing a conductive pattern in the M(i+2) level which corresponds to the second portion in the M(i+2) layer, then would be short enough to violate a minimum length design rule for a permissible conductive pattern in the M(i+2) level. An example of the M(i+2) level is the M2 level of the layout diagram, which corresponds to the M2 layer of a semiconductor device. An example of the M2 layer of a semiconductor device is M2 layer 214 of FIGS. 4A-4B. An example of the minimum length design rule for a permissible conductive pattern in the M(i+2) level is the first M2 design rule (discussed above), which has minimum length LM2. An example of the second deep via pattern, if otherwise regarded in part as representing a conductive pattern in the M(i+2) level, then being be short enough to violate the minimum length design rule for a permissible conductive pattern in the M(i+2) level, is deep via pattern 358(2) of FIGS. 3E-3F having, relative to the X-axis, size D2, where D2≤(≈LM2*X/2) in some embodiments. Again, in some embodiments, (≈LM2*X/6)≤D2≤(≈LM2*X/5).

Figure 7:
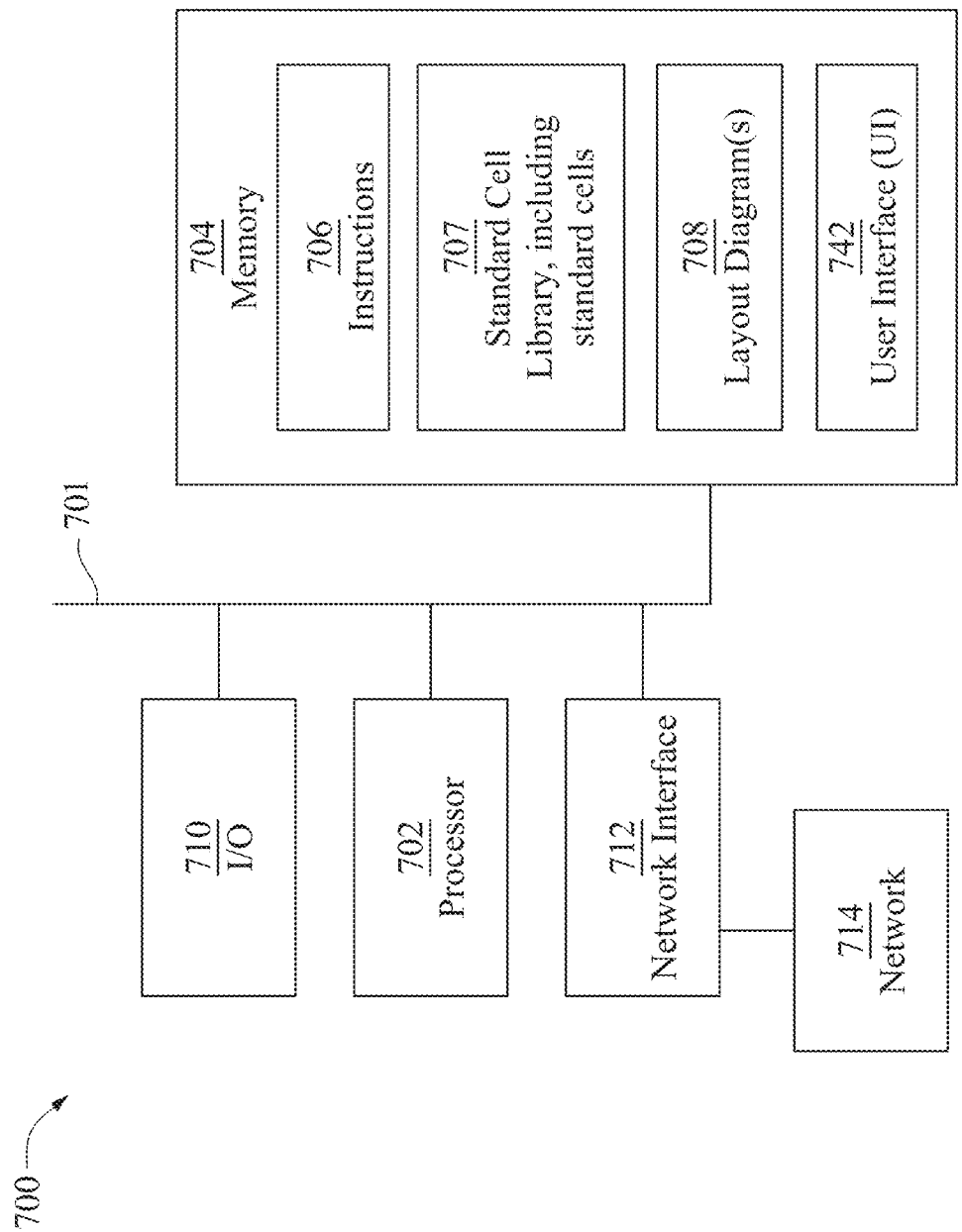
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an automatic placement and routing (APR) system. Methods described herein of generating PG layout diagrams, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of computer program code 706 by hardware processor 702 represents (at least in part) an EDA tool which implements a portion or all of a method according to an embodiment, e.g., the methods described herein in accordance with one or more embodiments (hereinafter, the noted processes and/or methods).

Processor 702 is electrically coupled to computer-readable storage medium 704 via a bus 701. Processor 702 is also electrically coupled to an I/O interface 710 by bus 701. A network interface 712 is also electrically connected to processor 702 via bus 701. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause EDA system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code (instructions) 706 configured to cause EDA system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 707 of standard cells including such standard cells as disclosed herein and one or more layout diagrams 708 such as are disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows EDA system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 700.

EDA system 700 is configured to receive information through I/O interface 710. The information received through I/O interface 710 includes one or more of instructions, data, design rules, libraries of standard cells, and/or other parameters for processing by processor 702. The information is transferred to processor 702 via bus 701. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
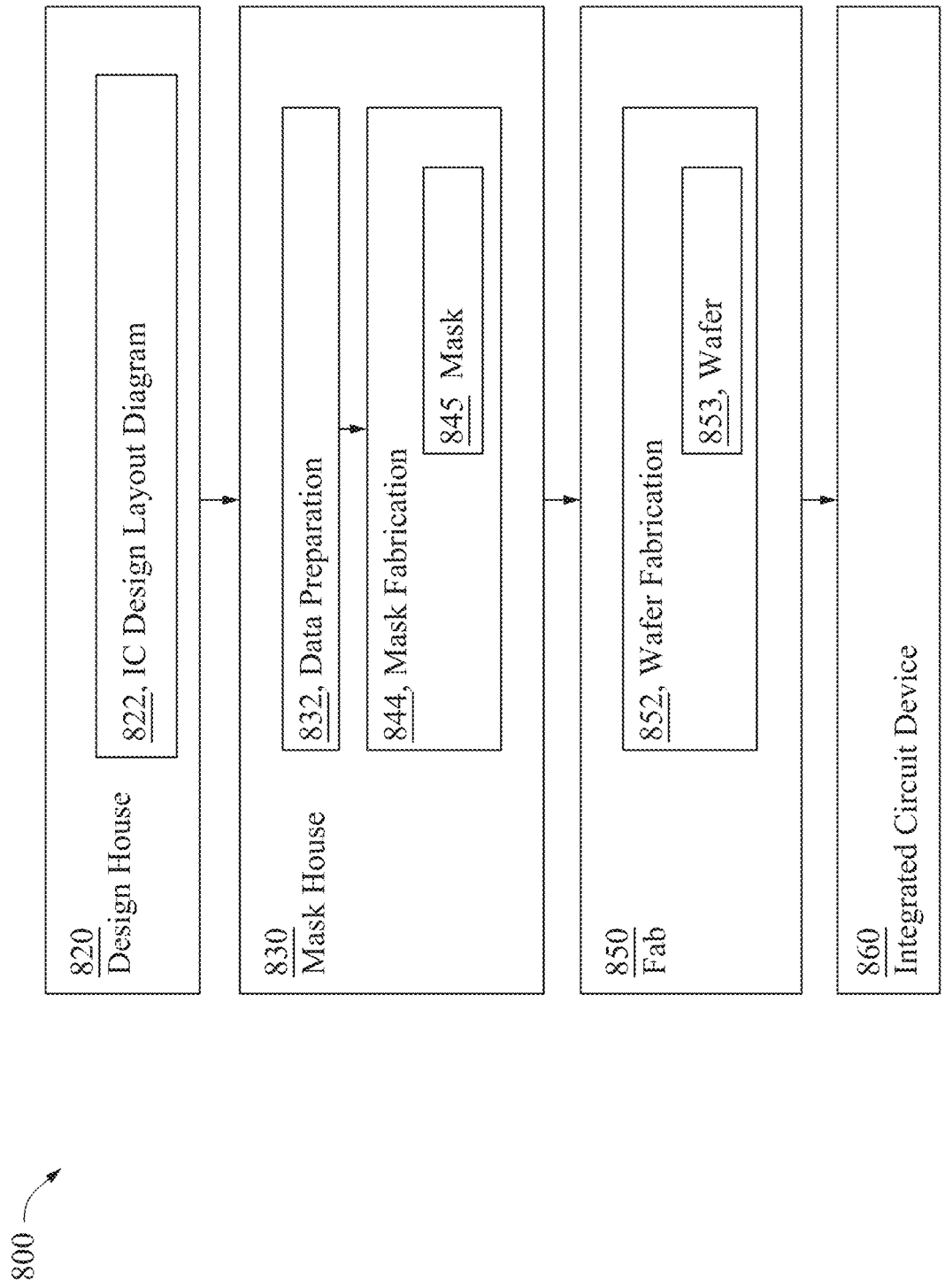
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in IC manufacturing system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes mask data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The IC design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., IC manufacturing system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device includes: a transistor layer; a first via layer over the transistor layer; a first metallization layer over the first via layer, the first metallization layer including first conductors having long axes extending substantially in a first direction; a second via layer over the first metallization layer; and a conductive deep via extending in the second via layer, the first metallization layer, and the first via layer. In some embodiments, the first conductors represent a majority of conductive material in the first metallization layer; and a size of the deep via in the first direction in the first metallization layer is substantially less than a minimum length of the first conductors in the first metallization layer.

In some embodiments, the minimum length of the first conductors in the first metallization layer is Lmin; the size of the deep via in the first direction in the first metallization layer is W such that: $W \leq (\approx Lmin*X/2)$; and X is a unit of measure.

In some embodiments, $W \leq (\approx Lmin/5)$.

In some embodiments, X is a contacted poly pitch (CPP).

In some embodiments, an aspect ratio, AR1, of the deep via is $AR1 \approx 5$.

In some embodiments, the semiconductor device further includes a conductive shallow via in the first via layer. In some embodiments, the shallow via overlaps a corresponding component representing conductive material included in an electrical path of a terminal of a corresponding transistor in the transistor layer; a size of the shallow via in the first direction is substantially less than a permissible minimum length of the first conductors in the first metallization layer; and an aspect ratio of the shallow via is substantially smaller than an aspect ratio of the deep via.

In some embodiments, the aspect ratio of the deep via is AR1, the aspect ratio of the shallow via is AR2, and $AR1/AR2 \approx 10/3$.

In some embodiments, a semiconductor device includes a transistor layer including gate structures spaced apart in a first direction, the gate structures being arranged with a pitch and extending in a second direction substantially perpendicular to the first direction; a first via layer over the transistor layer, the first via layer including a first conductive material; a first metallization layer over the first via layer, the first metallization layer including a second conductive material; and a second via layer over the first metallization layer, the second via layer including a third conductive material; first conductors in the first metallization layer and including the first conductive material, the first conductors being longer in the first direction than the second direction; and a deep via extending in a third direction substantially perpendicular to the first and second directions from the transistor layer through the second via layer, and including portions of the respective first, second and third conductive materials in the first via layer, the first metallization layer and the second via layer. In some embodiments, the first conductors have a length in the first direction that is substantially greater than the pitch, and the portion of the deep via in the first metallization layer has a length in the first direction that is substantially less than the pitch.

In some embodiments, the portion of the deep via in the first metallization layer is substantially square as determined in the first and second directions.

In some embodiments, the deep via contacts one of the gate structures.

In some embodiments, in the deep via, the portions of the respective first, second and third conductive materials in the first via layer, the first metallization layer and the second via layer each overlap a same one of the gate structures.

In some embodiments, in the deep via, the portions of the respective first, second and third conductive materials in the first via layer, the first metallization layer and the second via layer each have a substantially same length in the first direction.

In some embodiments, the semiconductor device further includes a conductive shallow via in the first via layer, an aspect ratio of the shallow via being substantially smaller than an aspect ratio of the deep via.

In some embodiments, the aspect ratio of the deep via is AR1, the aspect ratio of the shallow via is AR2, and $AR1/AR2 \approx 10/3$.

In some embodiments, the first conductors have a length that is at least a design rule minimum permissible length for conductors in the first metallization layer; and the portion of the deep via in the first metallization layer has a length that is substantially less than the design rule minimum permissible length for conductors in the first metallization layer.

In some embodiments, the first conductors and the portion of the deep via in the first metallization layer are formed of a same conductive material.

In some embodiments, a semiconductor device includes a transistor layer; a via layer V(i) over the transistor layer, where i is a non-negative integer; a metallization layer over the via layer V(i), the metallization layer including first conductors having long axes extending substantially in a first direction; a via layer V(i+1) over the metallization layer; and a conductive deep via extending in the via layer V(i+1), the metallization layer, and the via layer V(i), a length of the deep via in the first direction in the metallization layer being substantially less than a design rule minimum permissible length for conductors in the metallization layer.

In some embodiments, the deep via includes portions of respective conductive materials in the via layer V(i), the metallization layer and the via layer V(i+1).

In some embodiments, the transistor layer includes gate structures spaced apart in the first direction, the gate structures being arranged with a pitch and extending in a second direction substantially perpendicular to the first direction, and the portion of the deep via in the metallization layer has a length in the first direction that is substantially less than the pitch.

In some embodiments, the portion of the deep via in the metallization layer is substantially square as determined in the first direction and a second direction substantially perpendicular to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a transistor layer;
   a first via layer over the transistor layer;
   a first metallization layer over the first via layer, the first metallization layer including first conductors having long axes extending substantially in a first direction;
   a second via layer over the first metallization layer; and
   a conductive deep via extending in the second via layer, the first metallization layer, and the first via layer,
   wherein:
   the first conductors represent a majority of conductive material in the first metallization layer; and
   a size of the deep via in the first direction in the first metallization layer is substantially less than a minimum length of the first conductors in the first metallization layer.

2. The semiconductor device of claim 1, wherein:
   the minimum length of the first conductors in the first metallization layer is Lmin;
   the size of the deep via in the first direction in the first metallization layer is W such that:
   $W \leq (\approx Lmin*X/2)$; and
   X is a unit of measure.

3. The semiconductor device of claim 2, wherein:
$W \leq (\approx Lmin/5)$.

4. The semiconductor device of claim 2, wherein:
X is a contacted poly pitch (CPP).

5. The semiconductor device of claim 1, wherein:
an aspect ratio, AR1, of the deep via is AR1≈5.

6. The semiconductor device of claim 1, further comprising:
a conductive shallow via in the first via layer,
wherein:
the shallow via overlaps a corresponding component representing conductive material included in an electrical path of a terminal of a corresponding transistor in the transistor layer;
a size of the shallow via in the first direction is substantially less than a permissible minimum length of the first conductors in the first metallization layer; and
an aspect ratio of the shallow via is substantially smaller than an aspect ratio of the deep via.

7. The semiconductor device of claim 6, wherein:
the aspect ratio of the deep via is AR1, the aspect ratio of the shallow via is AR2, and AR1/AR2≈10/3.

8. A semiconductor device comprising:
a transistor layer including gate structures spaced apart in a first direction, the gate structures being arranged with a pitch and extending in a second direction substantially perpendicular to the first direction;
a first via layer over the transistor layer, the first via layer including a first conductive material;
a first metallization layer over the first via layer, the first metallization layer including a second conductive material; and
a second via layer over the first metallization layer, the second via layer including a third conductive material;
first conductors in the first metallization layer and including the first conductive material, the first conductors being longer in the first direction than the second direction; and
a deep via extending in a third direction substantially perpendicular to the first and second directions from the transistor layer through the second via layer, and including portions of the respective first, second and third conductive materials in the first via layer, the first metallization layer and the second via layer,
wherein:
the first conductors have a length in the first direction that is substantially greater than the pitch, and
the portion of the deep via in the first metallization layer has a length in the first direction that is substantially less than the pitch.

9. The semiconductor device of claim 8, wherein the portion of the deep via in the first metallization layer is substantially square as determined in the first and second directions.

10. The semiconductor device of claim 8, wherein the deep via contacts one of the gate structures.

11. The semiconductor device of claim 8, wherein, in the deep via, the portions of the respective first, second and third conductive materials in the first via layer, the first metallization layer and the second via layer each overlap a same one of the gate structures.

12. The semiconductor device of claim 8, wherein, in the deep via, the portions of the respective first, second and third conductive materials in the first via layer, the first metallization layer and the second via layer each have a substantially same length in the first direction.

13. The semiconductor device of claim 8, further comprising a conductive shallow via in the first via layer, an aspect ratio of the shallow via being substantially smaller than an aspect ratio of the deep via.

14. The semiconductor device of claim 13, wherein the aspect ratio of the deep via is AR1, the aspect ratio of the shallow via is AR2, and AR1/AR2≈10/3.

15. The semiconductor device of claim 8, wherein:
the first conductors have a length that is at least a design rule minimum permissible length for conductors in the first metallization layer; and
the portion of the deep via in the first metallization layer has a length that is substantially less than the design rule minimum permissible length for conductors in the first metallization layer.

16. The semiconductor device of claim 8, wherein the first conductors and the portion of the deep via in the first metallization layer are formed of a same conductive material.

17. A semiconductor device comprising:
a transistor layer;
a via layer V(i) over the transistor layer, where i is a non-negative integer;
a metallization layer over the via layer V(i), the metallization layer including first conductors having long axes extending substantially in a first direction;
a via layer V(i+1) over the metallization layer; and
a conductive deep via extending in the via layer V(i+1), the metallization layer, and the via layer V(i), a length of the deep via in the first direction in the metallization layer being substantially less than a design rule minimum permissible length for conductors in the metallization layer.

18. The semiconductor device of claim 17, wherein the deep via includes portions of respective conductive materials in the via layer V(i), the metallization layer and the via layer V(i+1).

19. The semiconductor device of claim 18, wherein:
the transistor layer includes gate structures spaced apart in the first direction, the gate structures being arranged with a pitch and extending in a second direction substantially perpendicular to the first direction, and
the portion of the deep via in the metallization layer has a length in the first direction that is substantially less than the pitch.

20. The semiconductor device of claim 18, wherein the portion of the deep via in the metallization layer is substantially square as determined in the first direction and a second direction substantially perpendicular to the first direction.

* * * * *